United States Patent [19]
Okubo et al.

[11] Patent Number: 6,097,766
[45] Date of Patent: *Aug. 1, 2000

[54] TIMING PHASE SYNCHRONIZATION DETECTING CIRCUIT AND DEMODULATOR

[75] Inventors: Seiji Okubo; Akinori Fujimura; Makoto Miyake, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/177,103

[22] Filed: Oct. 22, 1998

[30] Foreign Application Priority Data

Oct. 30, 1997 [JP] Japan .................................. 9-299067

[51] Int. Cl.[7] .................................................. H04L 27/14
[52] U.S. Cl. .......................... 375/324; 375/360; 375/371; 375/373
[58] Field of Search .................................... 375/324, 354, 375/355, 360, 371, 373; 370/516

[56] References Cited

U.S. PATENT DOCUMENTS

| | | | |
|---|---|---|---|
| 4,633,193 | 12/1986 | Scordo | 331/1 A |
| 4,675,558 | 6/1987 | Serrone et al. | 307/527 |
| 5,235,622 | 8/1993 | Yoshida | 375/106 |
| 5,400,370 | 3/1995 | Guo | 375/118 |
| 5,563,891 | 10/1996 | Wang | 370/102 |
| 5,651,031 | 7/1997 | Ishizu | 375/328 |

OTHER PUBLICATIONS

Yamamoto et al, "Arrangement and Characteristics of 384 kbps–/4 Shift QPSK Burst Demodulator", Japanese Telecommunication Institute Technical Report RCS 92–100, (1993–01), pp. 7–12.

Saito et al, "Adaptive Carrier Synchronization (ACT) Demodulation System for QPSK Mobile Wireless Transmission", Japanese Telecommunication Institute Report vol. J75–B–II No.8, Aug. 1992, pp. 499–507.

*Primary Examiner*—Stephen Chin
*Assistant Examiner*—Mohammad Ghayour

[57] ABSTRACT

A demodulator is made compact, and with a simple circuit arrangement, and also having a better bit error rate characteristic. A timing phase synchronization detecting circuit 219 judges any one of the following two conditions based upon baseband phase data 202, i.e., an UNLOCK (timing phase asynchronous) condition, and a LOCK (timing phase synchronous) condition. Based upon the judgement result of the timing phase synchronization detecting circuit 219, in a timing recovering means 221, a frequency range of a PLL (phase synchronization loop) is variable, whereas the number of data entered within 1 symbol time is variable in a frequency synchronizing means 222 and a carrier recovering means 223. A data demodulating means 224 outputs demodulation data 206 in response to baseband phase data 202 and a recovery carrier signal 205.

7 Claims, 14 Drawing Sheets

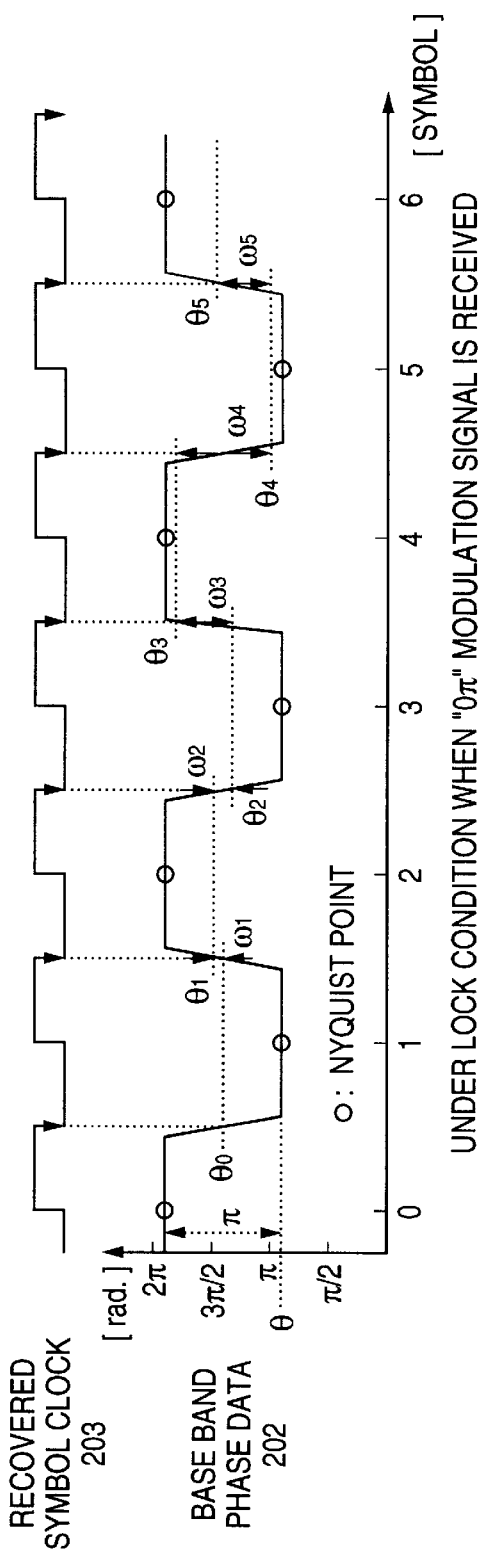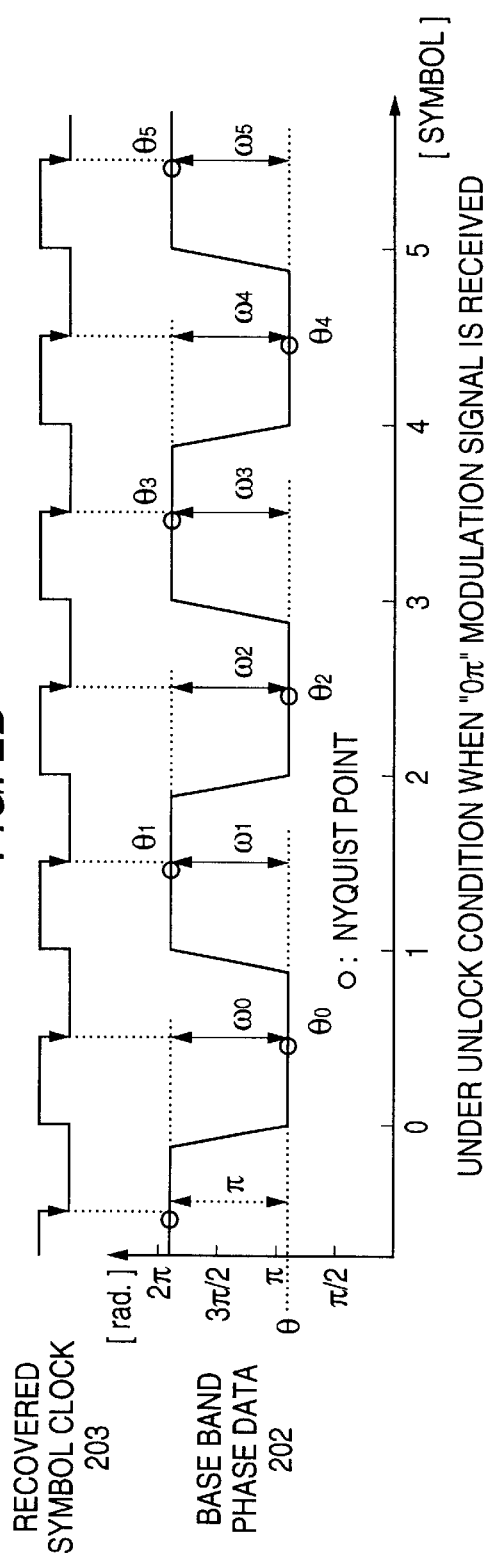

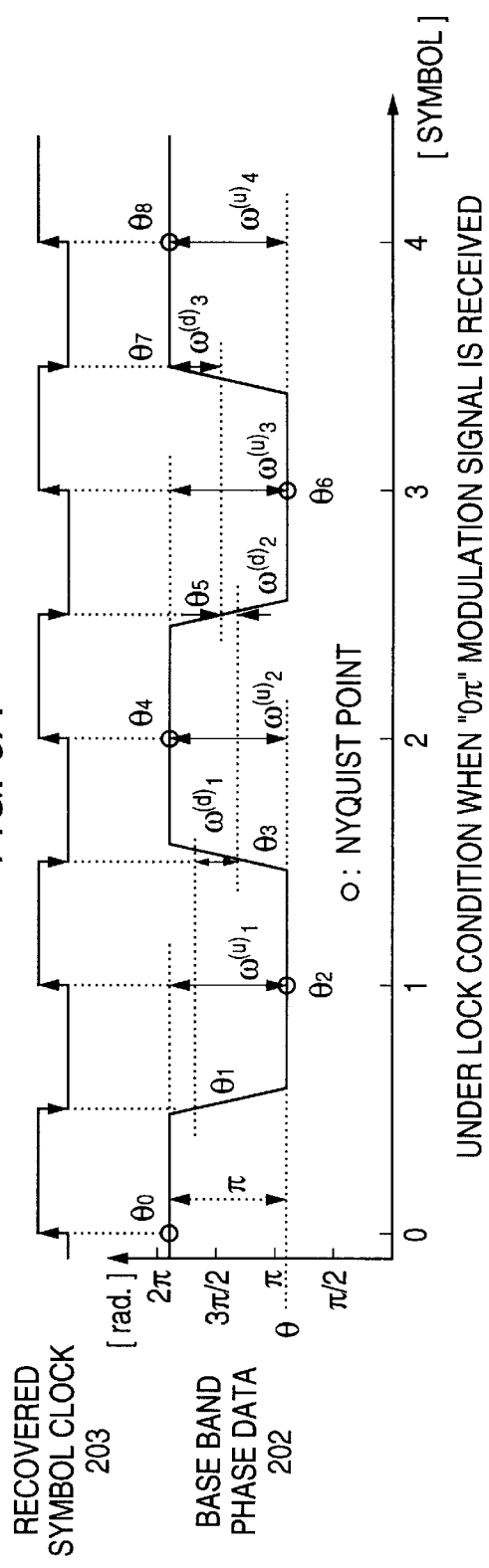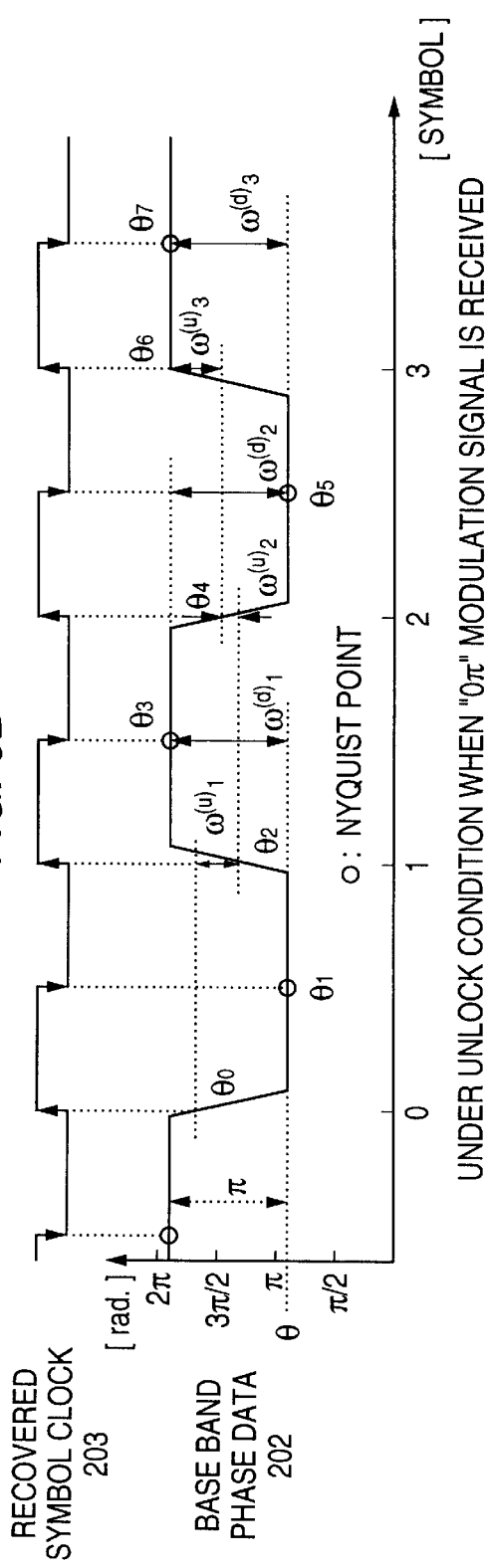

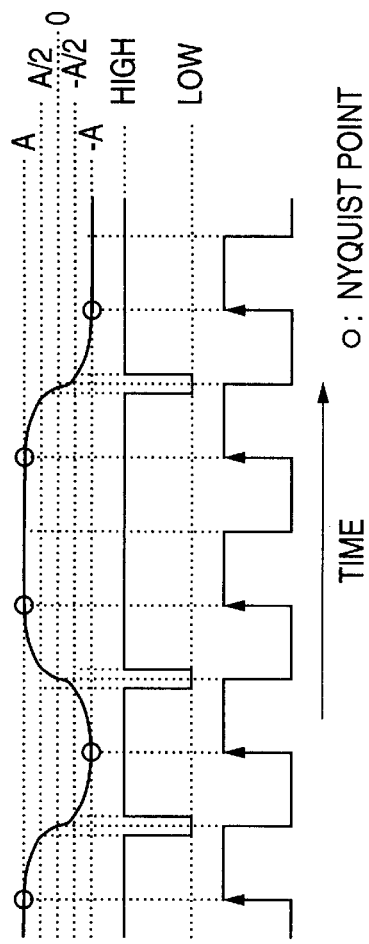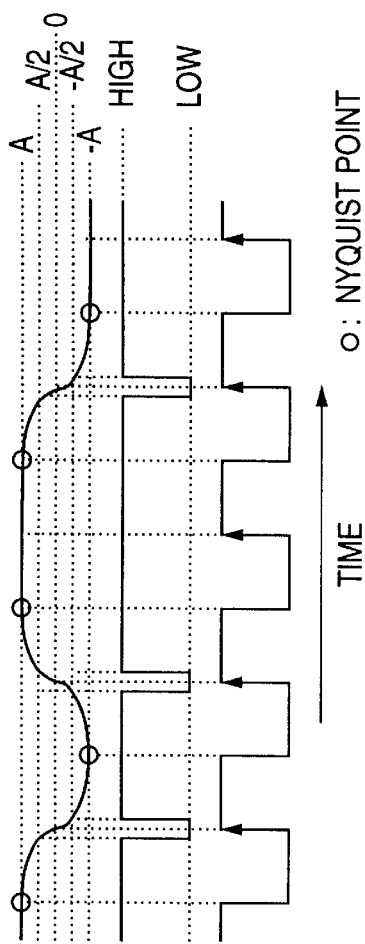

TIMING PHASE SYNCHRONIZATION DETECTING CIRCUIT AND DEMODULATOR

BACKGROUND OF THE INVENTION

1. Field of the Invention

The present invention is related to an improvement of a timing phase synchronization detecting circuit and a demodulator in a wireless (radio) communication field.

2. Description of the Related Art

FIG. 13 is a structural diagram for representing a conventional timing phase synchronization detecting circuit described in, for instance, U.S. Pat. No. 4,675,558.

In FIG. 13, reference numeral 101 shows a rectangular input signal having either a value of "A" (symbol "A" being a positive value) or a value of "−A"; reference numeral 102 indicates a clock; reference numeral 103 represents a timing phase synchronization signal for indicating as to whether or not a timing phase synchronization can be established between a Nyquist point of the input signal 101 and the clock 102; and reference numeral 111 shows a low-pass filter. Also, reference numeral 104 indicates a signal obtained by filtering the input signal 101 by the low-pass filter 111; reference numeral 131 denotes a NAND gate; and reference numeral 105 indicates a logic value outputted from the NAND gate 131. Then, reference numerals 112 and 113 are low-pass filters; reference numerals 121, 122, 123 show comparators; reference numeral 132 is a NOT gate; reference numerals 133 and 134 represent flip-flops; reference numeral 135 indicates a differentiator; and reference numeral 106 is an output result of the differentiator 135.

In this conventional timing phase synchronization detecting circuit, the comparator 121 first compares A/2 with the amplitude value of the signal 104. If the amplitude value of the signal 104 is smaller than, or equal to A/2, then the comparator 121 outputs either a logic "1" or "HIGH". Conversely, if the amplitude value of the signal 104 is larger than A/2, then the comparator 121 outputs either a logic "0" or "LOW".

Similarly, if the amplitude value of the signal 104 is larger than, or equal to −A/2, then the comparator 122 outputs either a logic "1" or "HIGH". Conversely, if the amplitude value of the signal 104 is smaller than −A/2, then the comparator 122 outputs either a logic "0" or "LOW".

The signal 105 corresponds to an output result of the NAND gate 131 in such a case that the output results of the comparators 121 and 122 are inputted to the NAND gate 131. In other words, when the value of the signal 104 is smaller than, or equal to −A/2, otherwise larger than A/2, then signal 105 represents either logic "1" or "HIGH", whereas when the value of the signal 104 is larger than −A/2, and also smaller than, or equal to A/2, the signal 105 indicates either a logic "0" or "LOW".

Next, in the flip-flops 133 and 134, the signal 105 is sampled in response to the respective rising edges and falling edges of the clock 102. The LPF 112 averages the value produced by sampling the signal 105 in response to the rising edge of the clock 102, and the LPF 113 averages the value produced by sampling the signal 105 in response to the falling edge of the clock 102 by employing the method of moving averages.

Next, in the differentiator 135, the output filtered from the LPF 113 is subtracted from the output filtered from the LPF 112 to output a differentiated value.

Finally, the comparator 123 compares the differentiated value 106 obtained from the differentiator 135 with a threshold value $V_{REF}$. In the case that the differentiated value 106 of the differentiator 135 is larger than, or equal to $V_{REF}$, the comparator 123 outputs either "1" or "HIGH" indicative of a timing phase synchronous condition as a timing phase synchronization signal 103. In the case that the differentiated value 106 of the differentiator 135 is smaller than $V_{REF}$, the comparator 123 outputs either "0" or "LOW" indicative of a timing phase asynchronous condition as the timing phase synchronization signal 103.

FIGS. 14A and 14B show an example of timing charts for the respective signals in the conventional timing phase synchronization detecting circuit. As seen from FIG. 14A, under such a condition that the rising edge of the clock 102 impinges at a point near the Nyquist point of the signal 104, the signal 105 sampled in response to the rising edge of the clock 102 indicates the value of "HIGH", whereas the signal 105 sampled in response to the falling edge of the clock 102 indicates either "HIGH" or "LOW".

Conversely, under such a condition that a timing phase difference between the rising edge of the clock 102 and the Nyquist point of the signal 104 is large (see FIG. 14B), if there is a change in the data, then the signal 105 indicates the value of "LOW", whereas if there is no change in the data, then the signal 105 indicates the value of "HIGH".

Also, under such a condition that a timing phase difference between the rising edge of the clock 102 and the Nyquist point of the signal 104 is large, if the signal 105 is sampled in response to the falling edge of the clock 102, then the signal 105 indicates the value of "HIGH".

As a result, in such a case that the rising edge of the clock 102 impinges at the point near the Nyquist point of the signal 104, since the output signal of the LPF 112 becomes larger than the output signal of the LPF 113, the logic value of the timing phase synchronization signal becomes the value of either "1" or "HIGH" indicative of the timing phase synchronous condition (FIG. 15).

Conversely, in the case that the timing phase difference between the rising edge of the clock 102 and the Nyquist point of the signal 104 is large, since the output signal of the LPF 112 becomes smaller than that of the LPF 113, the logic value of the timing phase synchronization signal 103 becomes the value of either "0" or "LOW" indicative of the timing phase asynchronous condition (FIG. 15). As previously described, in the conventional timing phase synchronization detecting circuit, it is possible to judge as to whether or not the input signal 101 is synchronized with the clock 102 based upon the logic value of the timing phase synchronization signal 103.

As previously explained, in the conventional timing phase synchronization detecting circuit, since the establishment of the timing phase synchronization is judged by employing the amplitude information of the input signal, the AGC (Automatic Gain Control) circuit is required in such a case that the variation in the amplitude value of the input signal is large. Also, the complex and large-scaled circuit arrangement of the demodulator is required. There is another problem that since the random pattern is employed as the reception signal, the detection precision of the timing phase synchronization would be deteriorated, depending upon differences in the received data stream.

Then, there is another problem in the conventional frequency synchronizing means for performing the carrier frequency synchronization with employment of the baseband signal sampled at the symbol rate (refer to, for instance, "ARRANGEMENT AND CHARACTERISTICS OF 384 kbps—π/4 SHIFT QPSK BURST DEMODULATOR" written by YAMAMOTO et al., Japanese Telecommunication Institute Technical Report RCS 92–100), and also in the conventional carrier recovering means for performing the carrier recovery (refer to, for example, "ADAPTIVE CARRIER SYNCHRONIZATION (ACT) DEMODULATION SYSTEM FOR QPSK MOBILE WIRELESS TRANSMISSION" written by SAITO et al., Japanese Telecommunication Institute Report Vol. J75-B-II No. 8, pages 499 to 507, issued in August 1992). That is, in such a case that the timing phase synchronization cannot be established between the recovered clock outputted from the timing recovering means and the Nyquist point of the baseband signal, the frequency synchronization characteristic and the jitter characteristic of the recovered carrier phase, which have been obtained by executing the frequency synchronizing means, are largely deteriorated, as compared with those obtained when the timing phase synchronization is established. As a consequence, the timing synchronization detecting operation cannot be applied until the recovered clock has completely captured the Nyquist point of the baseband phase signal.

Moreover, there are other problems. When the frequency range of the PLL is widened in the conventional timing recovering means, the highspeed timing recovering operation can be carried out. However, the jitter component of the recovered clock after the capture operation becomes large. Conversely, when the frequency range of the PLL is made narrow, although the jitter component of the recovered clock after the capture operation can be reduced, the timing phase capture operation would be delayed.

SUMMARY OF THE INVENTION

The present invention has been made to solve the above-described problem.

A primary object of the present invention is to provide a compact timing phase synchronization detecting circuit with having a simple circuit arrangement, and also a demodulator with using this timing phase synchronization detecting circuit, in which a demodulation is carried out by employing phase information of an input signal, which an AGC circuit required when the demodulation is carried out by using the amplitude information of the input signal is no longer required.

A secondary object of the present invention is to provide a timing phase synchronization detecting circuit capable of detecting a synchronization of a timing phase in high precision by utilizing a phase waveform of a "0π" modulation signal corresponding to the known pattern.

A third object of the present invention is to provide both a timing phase synchronization detecting circuit for detecting a synchronization condition of a timing phase in a high speed, and also a demodulator by which when an asynchronous condition is detected, timing is recovered in high precision; a carrier frequency synchronization and a carrier recovery can be performed in high speeds; a highspeed capture operation can be done; and further the carrier frequency synchronization and the carrier recovery can be executed in high stable conditions.

A timing phase synchronization detecting circuit, according to a first aspect of the invention, is featured by comprising:

phase variation amount calculating means for entering thereinto a baseband phase signal of a burst signal constructed of a preamble which is sampled in response to a falling edge of a recovered symbol clock and contains a "0π" modulation signal, and also a PSK-modulated random pattern; for differentiating the baseband phase signal by 1 symbol; and furthermore for converting the 1-symbol-differentiated baseband phase signal into an absolute value thereof to calculate a phase variation amount;

averaging means for executing an averaging process operation of a specific symbol of the phase variation amount; and comparing means for comparing a signal outputted from the averaging means with a specific threshold value to thereby output a timing phase synchronization signal indicative of any one of the following states:

such a condition (will be referred to as an "UNLOCK condition" hereinafter) that a timing phase difference between a rising edge of the recovered symbol clock and a Nyquist point of a baseband phase signal is large when the "0π" modulation signal is received; and such a condition (will be referred to a's a "LOCK condition" hereinafter) that the rising edge of the recovered clock impinges at a position near the Nyquist point of the baseband phase signal, or either noise or the PSK-modulated random pattern is received when the "0π" modulation signal is received.

A demodulator, according to a second aspect of the invention, is featured by comprising:

timing recovering means arranged by input means, bandpass filter means, limiter amplifying means, quadrature detecting means, sampling means, arc tangent means, and the timing phase synchronization detecting circuit as recited in claim 1, for controlling a phase of a recovered symbol clock in such a manner that a Nyquist point of a baseband phase signal is sampled at a rising edge of the recovered symbol clock; for outputting a recovered symbol clock used to sample a complex baseband signal by the sampling means in response to a rising edge and a falling edge (two times per 1 symbol in total); and for outputting to the sampling means, such a recovered symbol clock that when the timing phase synchronization detecting circuit detects the UNLOCK condition, a frequency range of a phase synchronization loop (will be abbreviated as a "PLL" hereinafter) is widened, whereas when the timing phase synchronization detecting circuit detects the LOCK condition, the frequency range of the PLL is made narrow; the input means inputting an IF burst signal constructed of a preamble having a "0π" modulation signal and a PSK-modulated random pattern; the bandpass filter means filtering the IF burst signal; said limiter amplifying means amplifying the filtered signal to produce a constant amplitude; the quadrature detecting means quadrature-detecting the limiter-amplified signal to thereby output a quadrature-detected signal as the complex baseband signal; the sampling means sampling the complex baseband signal in response to a rising edge and a falling edge of a recovered symbol clock used to recover the timing; arc tangent means outputting a vector angle of the complex baseband signal sampled by the sampling means as a baseband phase signal; and also the timing phase synchronization detecting circuit outputting the timing phase synchronization signal indicative of any one of the LOCK condition and the UNLOCK condition based upon the value of the baseband phase signal sampled at the falling edge of the recovered symbol clock;

frequency synchronizing means for executing a carrier frequency synchronization by using the baseband phase signal sampled in response to both the rising edge and the falling edge of the recovered symbol clock when the timing phase synchronization detecting circuit detects the UNLOCK condition; and for performing a carrier frequency synchronization by using only the baseband phase signal sampled at the rising edge of the recovered symbol clock when the timing phase synchronization detecting circuit detects the LOCK condition;

carrier recovering means for executing a carrier recovering operation by employing the baseband phase signal sampled in response to both the rising edge and the falling edge of the recovered symbol clock when the timing phase synchronization detecting circuit detects the UNLOCK condition; and for performing a carrier recovering operation by using only the baseband phase signal sampled in response to the rising edge of the recovered symbol clock when the timing phase synchronization detecting circuit detects the LOCK condition; and data demodulating means for demodulating reception data based upon both the baseband phase signal sampled at the rising edge of the recovered symbol clock and the recovered carrier signal outputted from the carrier recovering means to thereby output the demodulated data.

A timing phase synchronization detecting circuit, according to a third aspect of the invention, is featured by comprising:

rising-edge phase variation amount calculating means for calculating a phase variation amount of a rising edge of a recovered symbol clock in such a manner that a baseband phase signal of a burst signal is inputted into the rising-edge phase variation amount calculating means; the burst signal is constituted by a preamble having a "0π" modulation signal and sampled in response to both a rising edge and a falling edge of the recovered symbol clock, and also a PSK-modulated random pattern; the baseband phase signal sampled at the rising edge of the recovered symbol clock is differentiated by 1 symbol; and further the differentiated baseband phase signal is converted into an absolute value thereof;

falling-edge phase variation amount calculating means for calculating a phase variation amount of a falling edge of the recovered symbol clock in such a manner that the baseband phase signal sampled at the falling edge of the recovered symbol clock is differentiated by 1 symbol; and further the differentiated baseband phase signal is converted into an absolute value thereof;

differentiating means for calculating a differentiated phase variation amount by subtracting the falling-edge phase variation amount from the rising-edge phase variation amount every 1 symbol;

averaging means for executing an averaging process for a specific symbol of the differentiated phase variation amount; and comparing means for comparing a signal outputted from the averaging means with a specific threshold value to thereby output a timing phase synchronization signal indicative of any one of the following two conditions;

such a condition (will be referred to as an "UNLOCK" condition hereinafter) that a timing phase difference between the rising edge of the recovered symbol clock and a Nyquist point of the baseband phase signal is large, or either noise or the PSK-modulated random pattern is under reception when the "0π" modulation signal is received; and such a condition (will be referred to as a "LOCK condition" hereinafter) that the rising edge of the recovered symbol clock impinges at a point near the Nyquist point of the baseband phase signal when the "0π" modulation signal is received.

A timing phase synchronization detecting circuit, according to a fourth aspect of the invention, is featured by comprising:

rising-edge phase variation amount calculating means for calculating a phase variation amount of a rising edge of a recovered symbol clock in such a manner that a baseband phase signal of a burst signal is inputted into the rising-edge phase variation amount calculating means; the burst signal is constituted by a preamble having a "0π" modulation signal and sampled in response to both a rising edge and a falling edge of the recovered symbol clock, and also a PSK-modulated random pattern; the baseband phase signal sampled at the rising edge of the recovered symbol clock is differentiated by 1 symbol; and further the differentiated baseband phase signal is converted into an absolute value thereof;

falling-edge phase variation amount calculating means for calculating a phase variation amount of a falling edge of the recovered symbol clock in such a manner that the baseband phase signal sampled at the falling edge of the recovered symbol clock is differentiated by 1 symbol; and further the differentiated baseband phase signal is converted into an absolute value thereof;

differentiating means for calculating a differentiated phase variation amount by subtracting the falling-edge phase variation amount from the rising-edge phase variation amount every time any one of the rising-edge phase variation amount and the falling-edge phase variation amount is updated;

averaging means for performing an averaging process with respect to the differentiated phase variation amount specific calculating times; and comparing means for comparing a signal outputted from the averaging means with a specific threshold value to thereby output a timing phase synchronization signal indicative of any one of the following two conditions;

such a condition (will be referred to as an "UNLOCK" condition hereinafter) that a timing phase difference between the rising edge of the recovered symbol clock and a Nyquist point of the baseband phase signal is large, or either noise or the PSK-modulated random pattern is under reception when the "0π" modulation signal is received; and such a condition (will be referred to as a "LOCK condition" hereinafter) that the rising edge of the recovered symbol clock impinges at a point near the Nyquist point of the baseband phase signal when the "0π" modulation signal is received.

A timing phase synchronization detecting circuit, according to a fifth aspect of the invention, is featured by comprising:

rising-edge phase variation amount calculating means for calculating a phase variation amount of a rising edge of a recovered symbol clock in such a manner that a baseband phase signal of a burst signal is inputted into the rising-edge phase variation amount calculating means; the burst signal is constituted by a preamble having a "0π" modulation signal sampled in response to both a rising edge and a falling edge of the recovered symbol clock, a PSK-modulated unique word, and also a PSK-modulated random pattern; the baseband phase signal sampled at the rising edge of the recovered symbol clock is differentiated by 1 symbol; and further the differentiated baseband phase signal is converted into an absolute value thereof;

falling-edge phase variation amount calculating means for calculating a phase variation amount of a falling edge of the recovered symbol clock in such a manner that the baseband phase signal sampled at the falling edge of the recovered symbol clock is differentiated by 1 symbol; and further the differentiated baseband phase signal is converted into an absolute value thereof;

differentiating means for calculating a differentiated phase variation amount by subtracting the falling-edge phase variation amount from the rising-edge phase variation amount every time any one of the rising-edge phase variation amount and the falling-edge phase variation amount is updated;

averaging means for performing an averaging process with respect to the differentiated phase variation amount specific calculating times;

comparing means for comparing a signal outputted from the averaging means with a specific threshold value to thereby output a synchronization condition signal indicative of any one of the following two conditions;

such a condition (will be referred to as an "UNLOCK" condition hereinafter) that a timing phase difference between the rising edge of the recovered symbol clock and a Nyquist point of the baseband phase signal is large, or either noise or the PSK-modulated random pattern is under reception when the "0π" modulation signal is received; and such a condition (will be referred to as a "LOCK condition" hereinafter) that the rising edge of the recovered symbol clock impinges at a point near the Nyquist point of the baseband phase signal when the "0π" modulation signal is received;

unique word detecting means for detecting a unique word from demodulated data; and OR means for outputting a timing phase synchronization signal brought into the LOCK condition if a synchronization condition signal is brought into the LOCK condition, or the unique word detecting means detects the unique word.

A timing phase synchronization detecting circuit, according to a sixth aspect of the invention, is featured by comprising:

rising-edge phase variation amount calculating means for calculating a phase variation amount of a rising edge of a recovered symbol clock in such a manner that a baseband phase signal of a burst signal is inputted into the rising-edge phase variation amount calculating means; the burst signal is constituted by a preamble having a "0π" modulation signal and sampled in response to both a rising edge and a falling edge of the recovered symbol clock, and also a PSK-modulated random pattern; the baseband phase signal sampled at the rising edge of the recovered symbol clock is differentiated by 1 symbol; and further the differentiated baseband phase signal is converted into an absolute value thereof;

falling-edge phase variation amount calculating means for calculating a phase variation amount of a falling edge of the recovered symbol clock in such a manner that the baseband phase signal sampled at the falling edge of the recovered symbol clock is differentiated by 1 symbol; and further the differentiated baseband phase signal is converted into an absolute value thereof;

differentiating means for calculating a differentiated phase variation amount by subtracting said falling-edge phase variation amount from the rising-edge phase variation amount every time any one of the rising-edge phase variation amount and the falling-edge phase variation amount is updated;

first averaging means for performing an averaging process with respect to the differentiated phase variation amount specific calculating times;

first comparing means for comparing a signal outputted from the first averaging means with a first threshold value to thereby output a synchronization condition signal indicative of any one of the following two conditions;

such a condition (will be referred to as an "UNLOCK" condition hereinafter) that a timing phase difference between the rising edge of the recovered symbol clock and a Nyquist point of the baseband phase signal is large, or either noise or the PSK-modulated random pattern is under reception when the "0π" modulation signal is received; and such a condition (will be referred to as a "LOCK condition" hereinafter) that the rising edge of the recovered symbol clock impinges at a point near the Nyquist point of the baseband phase signal when the "0π" modulation signal is received;

second averaging means for averaging the falling-edge phase variation amount derived from the falling-edge phase variation amount calculating means;

second comparing means for comparing a signal outputted from the second averaging means with a second threshold value; and OR means for outputting a timing phase synchronization signal for indicating that any one of the first comparing means and the second comparing means is brought into the LOCK condition.

A demodulator, according to a seventh aspect of the invention, is featured by comprising:

input means for inputting an IF burst signal constructed of a preamble having a "0π" modulation signal and a PSK-modulated random pattern; bandpass filter means for filtering the IF burst signal; limiter amplifying means for amplifying the filtered signal to produce a constant amplitude; at quadrature detecting means for quadrature-detecting the limiter-amplified signal to thereby output a quadrature-detected signal as the complex baseband signal; sampling means sampling the complex baseband signal in response to a rising edge and a falling edge of a recovered symbol clock used to recover the timing; arc tangent means for outputting a vector angle of the complex baseband signal sampled by the sampling means as a baseband phase signal;

a timing phase synchronization detecting circuit as claimed in any one of claims 3 to 6, for judging as to whether the timing phase synchronization is under LOCK condition, or UNLOCK condition based upon a baseband phase signal value sampled at a rising edge and a falling edge of a recovered symbol clock and for outputting a judgement result as a timing phase synchronization signal;

timing generating means for controlling a phase of the recovered symbol clock in such a manner that a Nyquist point of the baseband phase signal is sampled at the rising edge of the recovered symbol clock; for widening a frequency range of a phase synchronization loop (will be abbreviated as a "PLL" hereinafter) when the timing phase synchronization circuit detects an UNLOCK condition; and for narrowing the frequency range of the PLL when the timing phase synchronization circuit detects a LOCK condition;

frequency synchronizing means for executing a carrier frequency synchronization by using the baseband phase signal sampled in response to both the rising edge and the falling edge of the recovered symbol clock when the timing phase synchronization detecting circuit detects the UNLOCK condition; and for performing a carrier frequency synchronization by using only the baseband phase signal sampled at the rising edge of the recovered symbol clock when the timing phase synchronization detecting circuit detects the LOCK condition;

carrier recovering means for executing a carrier recovering operation by employing the baseband phase signal sampled in response to both the rising edge and the falling edge of the recovered symbol clock when the timing phase synchronization detecting circuit detects the UNLOCK condition; and for performing a carrier recovering operation by using only the baseband phase signal sampled in response to the rising edge of the recovered symbol clock when the timing phase synchronization detecting circuit detects the LOCK condition; and data demodulating means for demodulating reception data based upon both the baseband phase signal sampled at the rising edge of the recovered symbol clock and the recovered carrier signal outputted from the carrier recovering means to thereby output the demodulated data.

BRIEF DESCRIPTION OF THE DRAWINGS

FIGS. 2A and 2B are diagrams for showing a characteristic of a value "ω" of a phase variation amount 207 shown in FIG. 1.

FIGS. 6A and 6B are diagrams for representing characteristics of a value ω(u) of a rising edge phase variation amount 301, and of a phase variation amount ω(d) of a falling edge, shown in FIG. 5.

FIGS. 14A and 14B are diagrams for representing an example of the timing chart of the respective signals indicated in FIG. 13.

DETAILED DESCRIPTION OF THE PREFERRED EMBODIMENTS

Now, a description of the invention will be given in more detail of preferred embodiments of the present invention with reference to the accompanying drawings.

(EMBODIMENT 1)

In accordance with this embodiment, a timing phase synchronization detecting circuit and a demodulator with employment of this timing phase synchronization detecting circuit are accomplished in which while a "0π" modulation signal is used as the known pattern employed in a preamble, a synchronization capturing operation is quickly performed, and the synchronization is maintained under stable condition after the synchronization capturing operation has been carried out. The phase of the "0π" modulation signal is varied by π[radian] every 1 symbol.

Figure 1:
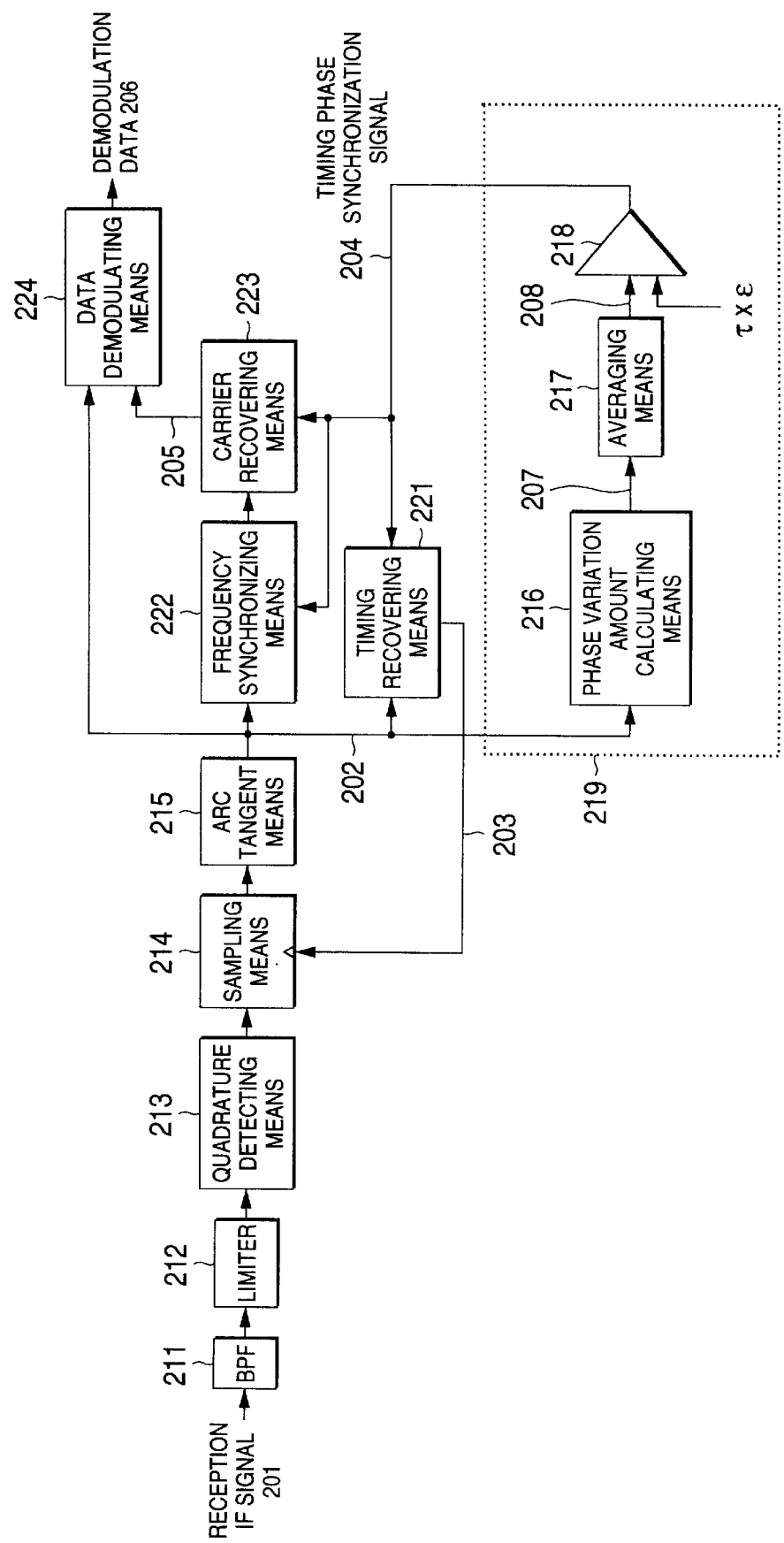
FIG. 1 is a structural diagram for indicating a timing phase synchronization detecting circuit and a demodulator with employment of this timing phase synchronization detecting circuit according to an embodiment 1 of the present invention.

FIG. 1 is a structural diagram for representing a timing phase synchronization detecting circuit and also a demodulator with using this timing phase synchronization detecting circuit, according to this embodiment.

In this drawing, reference numeral 201 shows a reception IF signal; reference numeral 202 indicates a baseband phase data; reference numeral 204 represents a timing phase synchronization signal; reference numeral 207 denotes a phase variation amount; reference numeral 208 shows an average value signal of the phase variation amount; reference numeral 211 indicates sampling means; reference numeral 212 represents limiter amplifying means; reference numeral 213 quadrature detecting means; and reference numeral 214 denotes sampling means. Also, reference numeral 215 represents arc tangent means; reference numeral 219 represents a timing phase synchronization detecting circuit; reference numeral 221 denotes timing recovering means; reference numeral 222 shows frequency synchronizing means; reference numeral 223 is carrier recovering means; reference numeral 224 shows data demodulating means; and reference numeral 203 is a recovered symbol clock, and this recovered symbol clock is outputted from the feedback type timing recovering means 221. Further, reference numeral 205 shows a recovered carrier phase signal, and this carrier phase signal is outputted from the carrier recovering means 223. Reference numeral 206 represents demodulation data demodulated by the data demodulating means 224.

Then, in the timing phase synchronization detecting circuit 219, reference numeral 216 shows phase variation amount calculating means; reference numeral 217 represents averaging means; and reference numeral 218 indicates comparing means. The timing phase detecting circuit 219 judges any one of the below-mentioned two conditions based upon such a baseband phase data 202 sampled at a falling edge of the recovered symbol clock 203:

UNLOCK CONDITION: Such a condition that a timing phase difference between a rising edge of the recovered symbol clock 203 and a Nyquist point of the baseband phase data 202 is large when the "0π" modulation signal is received.

LOCK CONDITION: Such a condition that the rising edge of the recovered symbol clock 203 impinges at a point near the Nyquist point of the baseband phase data 202 when the "0π" modulation signal is received. Otherwise, either noise or a PSK-modulated random pattern is received.

Next, a description will now be made of operations of the demodulator according to the embodiment 1 of the present invention. In FIG. 1, in the demodulator according to the embodiment 1, first of all, the reception IF signal 201 is filtered by the bandpass filter means 211, and then the filtered IF signal is amplified by the limiter amplifying means 212 so as to obtain a constant amplitude thereof. Then, the amplified signal is quadrature-detected by the quadrature detecting means 213 to output a complex baseband signal. Then, the sampling means 214 samples the complex baseband signal outputted from the quadrature detecting means 213 at the rising edge of the recovered symbol clock 203 and the falling edge thereof (two times per 1 symbol in total). Furthermore, the arc tangent means 215 calculates a vector angle of the composite baseband signal from this composite baseband signal sampled by said sampling means 214 to thereby produce the baseband phase data 202.

Next, operations of the timing phase synchronization detecting circuit 219 will now be explained. In the timing phase synchronization detecting circuit 219 of the present invention, as indicated in the below-mentioned formula, the phase variation amount calculating means 216 differentiates a phase data stream (series) $\{\theta_i\}$ [radian] by 1 symbol, and further converts the differentiated phase data stream into an absolute value thereof, so that a value "$\omega_i (0 \leq \omega_i \leq \pi)$" of the phase variation amount 207 is calculated. It should be noted that the baseband phase data 202 is sampled at the falling edge of the recovered symbol clock 203 to obtain the phase data stream $\{\theta_i\}$ [radian], in which symbol "i"=0, 1, 2, 3, - - - ):

$$\omega_i = \min\{|\theta_i - \theta_{i-1}|, 2\pi - |\theta_i - \theta_{i-1}|\}$$

In FIG. 2A and FIG. 2B, there are shown characteristics of "$\omega_i$" when the "0π" modulation is received. As indicated in FIG. 2A, when the "0π" modulation signal is received, in such a case that the rising edge of the recovered symbol clock 203 impinges at a point near the Nyquist point of the baseband phase data (namely, under LOCK condition), the value of "$\omega_i$" owns such a random value defined between zero radian (minimum value) and π radian (maximum value). Conversely, in such a case that a timing phase difference between the rising edge of the recovered symbol clock 203 and the Nyquist point of the baseband phase data (namely, under UNLOCK condition), as represented in FIG. 2B, the value of $\omega_i$ continuously owns such a value approximated to the π radian. When a PSK-modulated random pattern is received, since the phase of the baseband signal is varied at random between $\{0, \pi\}$ every 1 symbol in, for instance, BPSK, whereas this phase of the baseband signal is varied at random among $\{0, +\pi/2, -\pi/2, \pi\}$ every 1 symbol in QPSK, the value "$\omega_i$" owns random values irrespective of the timing phase. Similarly, when a noise component is received, the value "$\omega_i$" owns random values irrespective of the timing phase.

Returning back to FIG. 1, the operations of the demodulator will now be again made. The averaging means 217 enters "$\omega_i$" having the above-described value into a shift register arranged by "τ" stages (symbol "τ" being a natural number) every 1 symbol, and outputs a value of a total value "$\Omega_i$" for τ symbols of $\omega_i$ as the average value signal 208 of the phase variation amount:

$$\Omega_i = \sum_{j=i-\tau+1}^{i} \omega_j \quad (1)$$

In such a case that the timing synchronization is established under which the rising edge of the recovered symbol clock 203 impinges at the point near the Nyquist point of the baseband phase data 202 while the "0π" modulation signal is received, either when the PSK-modulated random pattern is received or when the noise is received, since $\omega_i$ is equal to such a random value between 0 and π radian, $\Omega_i$ indicates a small value. To the contrary, when the "0π" modulation signal is received, in such a case that the timing phase difference between the rising edge of the recovered symbol clock 203 and the Nyquist point of the phase data 202 is large, since $\omega_i$ continuously owns a value approximated to τ radian, $\Omega_i$ owns a large value.

Figure 3:
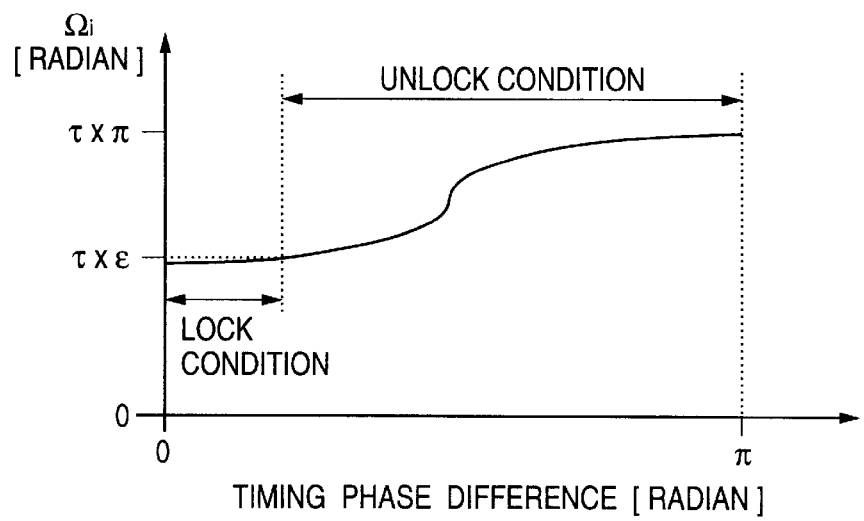
FIG. 3 is a diagram for representing a characteristic of a value "Ω" of an average value signal 208 of a phase variation amount with respect to a timing phase difference when the "0π" modulation signal is received.

FIG. 3 graphically represents a characteristic of the value $\Omega_i$ of the average value signal 208 of the phase variation amount with respect to the timing phase difference when the "0π" modulation signal is received.

As a consequence, the comparing means 218 compares the value $\Omega_i$ of the average value signal 208 with a value obtained by "τ×∈" (π/2<∈<π). If $\Omega_i \leq \tau \times \in$, then the timing phase synchronization detecting circuit 219 judges the present condition as an "UNLOCK condition" (see FIG. 3) indicative of such a condition that the timing phase difference between the rising edge of the recovered symbol clock 203 and the Nyquist point of the baseband phase data 202 when the "0π" modulation signal is received. Conversely, if $\Omega_i < \tau \times \in$, then the timing phase synchronization detecting circuit 219 of the present invention judges the present condition as a "LOCK" condition (see FIG. 3) indicative of a timing phase synchronization condition while the "0π" modulation signal is received, a PSK-modulated random pattern reception condition, or a noise reception condition.

As previously described, in accordance with the timing phase synchronization detecting circuit 219 of the present invention, since the timing phase synchronization is judged by using the phase waveform of the "0π" modulation signal known in the field, the high-precision judgement of the timing phase synchronization can be carried out, as compared with another case that the phase waveform of the random pattern is employed. Also, since the timing phase synchronization detecting circuit 219 of the present invention employs the phase information, this timing phase synchronization detecting circuit 219 can be realized by a compact and simple circuit arrangement in which the limiter amplifier is employed at the prestage of the demodulator.

Next, a description will now be made of operations of the demodulator with using the timing phase synchronization signal produced in the above-described manner.

When the above-described timing phase synchronization signal 204 indicates the "UNLOCK condition", the frequency range of the PLL used in the timing recovering means 221 is widened, and also the timing synchronization is carried out in high speed. Conversely, when the above-described timing phase synchronization signal 204 indicates the "LOCK condition", the frequency range of the PLL used in the timing recovering means 221 is narrowed, and also the timing synchronization is brought into the high stable condition.

Also, when the timing phase synchronization signal 204 indicates the "UNLOCK condition", the baseband phase data 202 which is sampled in response to both the rising edge and the falling edge of the recovered symbol clock 203 is used as the input of the frequency synchronizing means 222, so that the carrier frequency synchronization is captured in high speed. To the contrary, when the timing phase synchronization signal 204 indicates the "LOCK condition", the baseband phase data 202 which is sampled in response only to the rising edge of the recovered symbol clock 203 is employed as the input of the frequency synchronizing means 222, so that the carrier frequency synchronization is carried out under high stable condition.

Furthermore, when the timing phase synchronization signal 204 indicates the "UNLOCK condition", the baseband phase data 202 which is sampled in response to both the rising edge and the falling edge of the recovered symbol clock 203 is used as the input of the carrier recovering means 223, so that the carrier phase is captured in high speed. To the contrary, when the timing phase synchronization signal 204 indicates the "LOCK condition", the baseband phase data 202 which is sampled in response only to the rising edge of the recovered symbol clock 203 is employed as the input of the carrier recovering means 223, so that the carrier recovery is carried out under high stable condition.

The data demodulating means 224 extracts the demodulation data 206 based upon both the sample phase data and the recovered carrier phase signal 205 outputted from the carrier recovering means 223. The sample phase data is produced by sampling the baseband phase data 202 at the rising edge of the recovered symbol clock 203 outputted from the timing recovering means 221.

Figure 4:
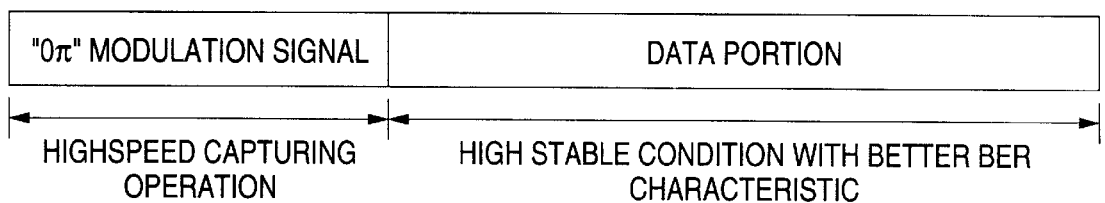
FIG. 4 is a diagram for showing a burst format to be demodulated by employing the present invention.

As a result, in the case that a burst signal having such a burst format as shown in FIG. 4 is received, the timing phase capturing operation, the carrier frequency capturing operation, and also the carrier frequency phase capturing operation can be quickly completed while the "0π" modulation signal is received. In the data portion, the better BER (bit error rate) characteristic can be obtained, since the jitter component of the timing phase is small, and both the carrier frequency and the carrier phase can be synchronized under high stable condition.

(EMBODIMENT 2)

In the embodiment 1, the timing phase synchronization detecting circuit averages the phase variation amount from the baseband phase data 202, and judges as to whether or not the timing phase synchronization can be established based on the predetermined value and the comparison result.

In this embodiment 2, the timing phase synchronization detecting circuit averages a difference value between a phase variation amount of a rising edge and a phase variation amount of a falling edge from the baseband phase data 202, and judges as to whether or not the timing phase synchronization can be established based on a predetermined value and the comparison result.

Figure 5:
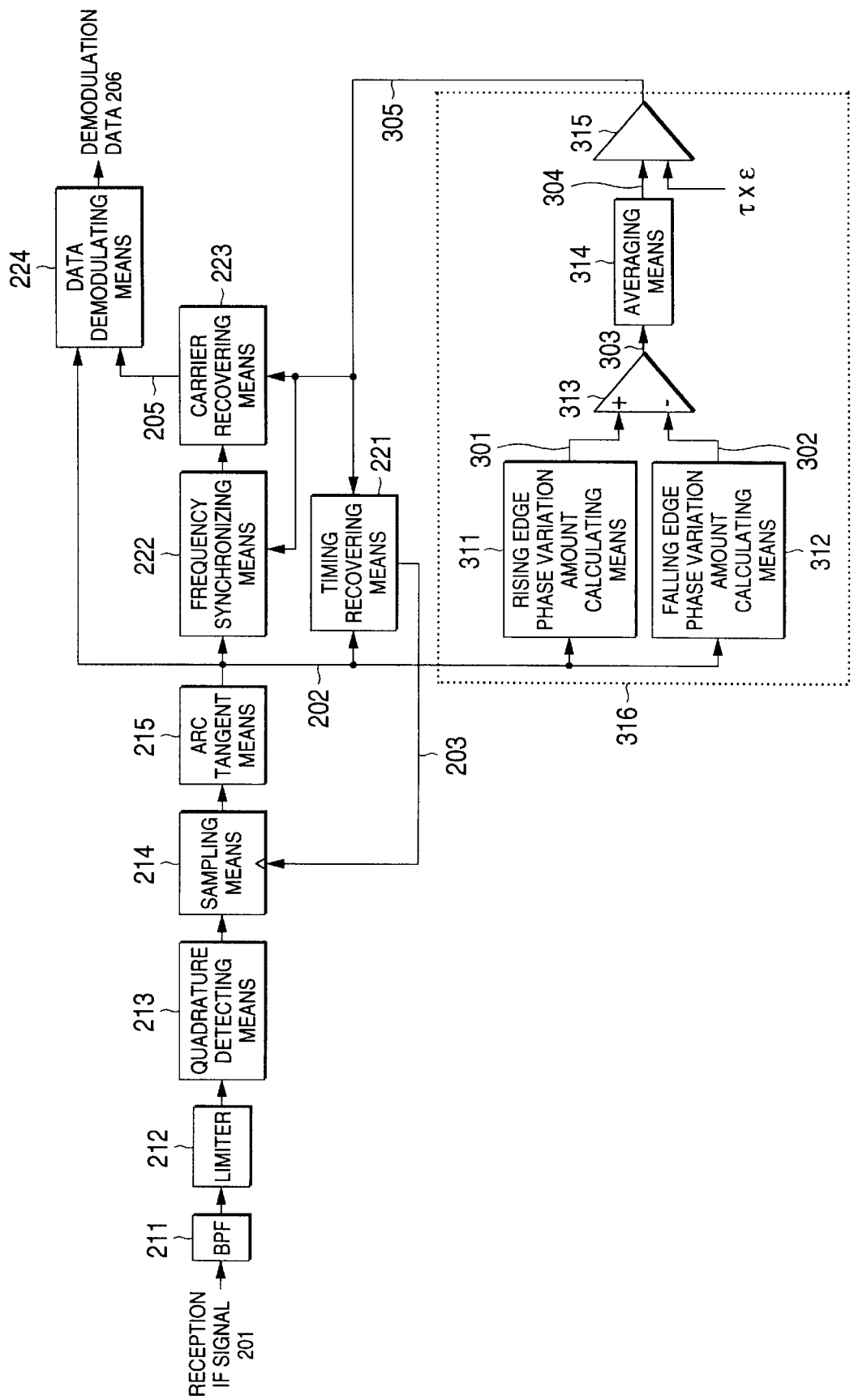
FIG. 5 is a structural diagram for indicating a timing phase synchronization detecting circuit and a demodulator with employment of this timing phase synchronization detecting circuit according to an embodiment 2 of the present invention.

FIG. 5 is a structural diagram for indicating a timing phase synchronization detecting circuit and a demodulator with employment of this timing phase synchronization detecting circuit, according to this embodiment 2.

In this drawing, reference numeral 301 shows a phase variation amount of a rising edge; reference numeral 302 represents a phase variation amount of a falling edge; reference numeral 303 denotes a differentiated phase variation amount; reference numeral 304 indicates an average value signal of the differentiated phase variation amount; reference numeral 305 represents a timing phase synchronization signal; and reference numeral 316 shows a timing phase synchronization detecting circuit.

In the timing phase synchronization detecting circuit 316, reference numeral 311 shows rising edge phase variation amount calculating means; reference numeral 312 represents falling edge phase variation amount calculating means; reference numeral 313 indicates differentiating means; reference numeral 314 indicates averaging means; and reference numeral 315 denotes comparing means. Other circuit elements are identical to those of FIG. 1, and therefore, descriptions thereof are omitted.

The timing phase detecting circuit 316 judges any one of the below-mentioned two conditions based upon such a baseband phase data 202 sampled at a falling edge of the recovered symbol clock 203:

UNLOCK CONDITION: Such a condition that a timing phase difference between a rising edge of the recovered symbol clock 203 and a Nyquist point of the baseband phase data 202 is large when the "0π" modulation signal is received. Otherwise, either noise or a PSK-modulated random pattern is received.

LOCK CONDITION: Such a condition that the rising edge of the recovered symbol clock 203 impinges at a point near the Nyquist point of the baseband phase data 202 when the "0π" modulation signal is received.

Next, a description will now be made of operations of the demodulator according to the embodiment 2 of the present invention. In the demodulator according to the embodiment 2, first of all, the reception IF signal 201 is filtered by the bandpass filter means 211, and then the filtered IF signal is amplified by the limiter amplifying means 212 so as to obtain a constant amplitude thereof. Then, the amplified signal is quadrature-detected by the quadrature detecting means 213 to output a complex baseband signal. Then, the sampling means 214 samples the complex baseband signal outputted from the quadrature detecting means 213 at the rising edge of the recovered symbol clock 203 and the falling edge thereof (two times per 1 symbol in total). Furthermore, the arc tangent means 215 calculates a vector angle of the composite baseband signal from this composite baseband signal sampled by said sampling means 214 to thereby produce the baseband phase data 202.

Next, operations of the timing phase synchronization detecting circuit 316 will now be explained. In the timing phase synchronization detecting circuit 316 of the present invention, as indicated in the below-mentioned formula, the rising edge phase variation amount calculating means 311 differentiates the phase data stream sampled at the rising edge by 1 symbol with respect to another phase data stream $\{\theta_i\}$ [radian] (note that i=0, 1, 2, 3, - - - ), which is produced by sampling the received phase data 202 at the rising edge and the falling edge of the recovered symbol clock 203. Furthermore, the rising edge phase variation amount calculating means 311 converts this differentiated data stream into an absolute value thereof, so that a value F(u); of the rising edge phase variation amount 301 ($0 \leq \omega^{(u)}_j \leq \pi$, j=0, 1, 2, 3, - - - ):

$$\omega^{(u)}_j = \min\{|\theta_{2j}-\theta_{2(j-1)}|, 2\pi-|\theta_{2j}-\theta_{2(j-1)}|\}$$

Similarly, the falling edge phase variation amount calculating means 312 calculates a value $\omega^{(d)}_j$ of the falling edge phase variation amount 302 ($0 \leq \omega^{(d)}_j \leq \pi$), as indicated in the following formula:

$$\omega^{(d)}_j = \min\{|\theta_{2j+1}-\theta_{2(j-1)+1}|, 2\pi-|\theta_{2j+1}-\theta_{2(j-1)+1}|\}$$

In FIG. 6A and FIG. 6B, there are shown characteristics of $\omega^{(u)}_j$ and $\omega^{(d)}_j$ when the "0π" modulation is received. As indicated in FIG. 6A, when the "0π" modulation signal is received, in such a case that the rising edge of the recovered symbol clock 203 impinges at a point near the Nyquist point of the baseband phase data (namely, under timing phase synchronous condition), the rising edge phase variation amount $\omega^{(u)}_j$ continuously owns a value approximated to $\pi$ radian (maximum value). Conversely, in such a case that a timing phase difference between the rising edge of the recovered symbol clock 203 and the Nyquist point of the baseband phase data (namely, under timing phase asynchronous condition), as represented in FIG. 6B, the rising phase variation amount $\omega^{(u)}_j$ owns such a random value between 0 radian (minimum value) and $\pi$ radian (maximum value). It should be noted that since the falling edge phase variation amount $\omega^{(d)}_j$ is identical to $\omega_j$ in the embodiment 1 ($\omega^{(d)}_{j=\omega j}$), description thereof is omitted (FIG. 2). Also, when the PSK-modulated random pattern is received, or when the noise component is received, both $\omega^{(u)}_j$ and $\omega^{(d)}_j$ own random values irrespective of the timing phase of the recovered symbol clock 203.

Returning back to FIG. 5, the operations of the demodulator will now be again made. As represented in the below-mentioned formula, the differentiating means 313 calculates a value $\omega^{(D)}_j$ ($-\pi \leq \omega^{(D)}_j \leq \pi$) of the differentiated phase variation amount 303:

$$\omega^{(D)}_j = \omega^{(u)}_j - \omega^{(D)}_j$$

Since $\Omega^{(u)}_j$ and $\omega^{(d)}_j$ own the above-explained values, there are great possibilities that $\omega^{(D)}_j$ owns a positive value under timing phase synchronous conditions, whereas $\omega^{(D)}_j$ owns a value defined between 0 and a negative value under timing phase asynchronous condition. When either noise is received or the PSK-modulated random pattern is received, $\omega^{(D)}_j$ owns a random value defined between $-\pi$ and $\pi$.

Figure 7:
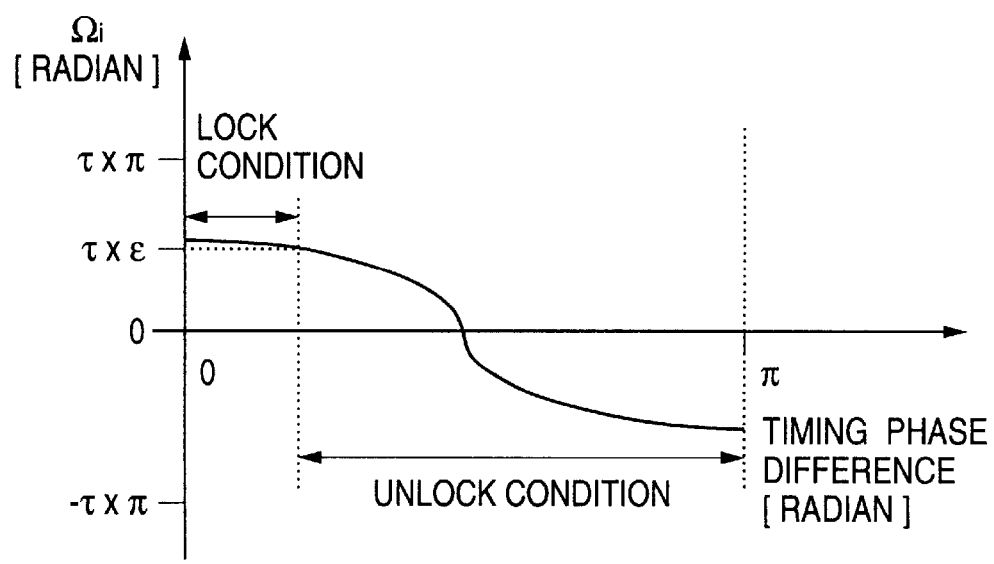
FIG. 7 is a diagram for representing a characteristic of a value "Ω" of an average value signal 304 of a differentiated phase variation amount shown in FIG. 5 with respect to a timing phase difference when the "0π" modulation signal is received.

The averaging means 314 enters "$\omega^{(D)}_j$" having the above-described value into a shift register arranged by "$\tau$" stages (symbol "$\tau$" being a natural number) every 1 symbol, and outputs a value of a total value "$\Omega_j$" of $\Omega^{(D)}_j$ for $\tau$ as an average value signal 304 of the phase variation amount, as indicated in the following formula:

FIG. 7 graphically represents a characteristic of the value $\Omega_j$ of the average value signal 304 of the phase variation amount with respect to the timing phase difference when the "$0\pi$" modulation signal is received.

$$\Omega_j = \sum_{t=j-\tau+1}^{j} \omega^{(D)t} \quad (2)$$

As a consequence, the comparing means 315 compares the value $\Omega_j$ of the average value signal 304 with a value obtained by "$\tau \times \in$" ($0 < \in < \pi$). If $\Omega_j \geq \tau \times \in$, then the timing phase synchronization detecting circuit 316 judges the present condition as an "UNLOCK condition" (see FIG. 7). Conversely, if $\Omega_j < \tau \times \in$, then the timing phase synchronization detecting circuit 316 of the present invention judges the present condition as a "LOCK" condition (see FIG. 7).

As previously described, in accordance with the timing phase synchronization detecting circuit 316 of the embodiment 2 of the present invention, the timing phase synchronization can be judged as either the "UNLOCK condition" or the "LOCK condition" based upon the baseband phase data 202. Then, since the timing phase synchronization detecting circuit according to the embodiment 2 of the present invention judges the timing phase synchronization by employing not only the falling edge phase variation amount, but also the rising edge phase variation amount, the timing phase synchronization can be judged in high precision when the "$0\pi$" modulation signal is received, as compared with the above-described timing phase detecting circuit of the embodiment 1 of the present invention, which judges the timing phase synchronization by using only the falling edge phase variation amount.

Next, a description will now be made of operations of the demodulator with using the timing phase synchronization signal produced in the above-described manner.

When the above-described timing phase synchronization signal 316 indicates the "UNLOCK condition", the frequency range of the PLL used in the timing recovering means 221 is widened, and also the timing synchronization is carried out in high speed. Conversely, when the above-described timing phase synchronization signal 316 indicates the "LOCK condition", the frequency range of the PLL used in the timing recovering means 221 is narrowed, and also the timing synchronization is brought into the high stable condition.

Also, when the timing phase synchronization signal 316 indicates the "UNLOCK condition", the baseband phase data 202 which is sampled in response to both the rising edge and the falling edge of the recovered symbol clock 203 is used as the input of the frequency synchronizing means 222, so that the carrier frequency synchronization is captured in high speed. To the contrary, when the timing phase synchronization signal 204 indicates the "LOCK condition", the baseband phase data 202 which is sampled in response only to the rising edge of the recovered symbol clock 203 is employed as the input of the frequency synchronizing means 222, so that the carrier frequency synchronization is carried out under high stable condition.

Furthermore, when the timing phase synchronization signal 316 indicates the "UNLOCK condition", the baseband phase data 202 which is sampled in response to both the rising edge and the falling edge of the recovered symbol clock 203 is used as the input of the carrier recovering means 223, so that the carrier phase is captured in high speed. To the contrary, when the timing phase synchronization signal 316 indicates the "LOCK condition", the baseband phase data 202 which is sampled in response only to the rising edge of the recovered symbol clock 203 is employed as the input of the carrier recovering means 223, so that the carrier recovery is carried out under high stable condition.

The data demodulating means 224 extracts the demodulation data 206 based upon both the sample phase data and the recovered carrier phase signal 205 outputted from the carrier recovering means 223. The sample phase data is produced by sampling the baseband phase data 202 at the rising edge of the recovered symbol clock 203 outputted from the timing recovering means 221.

As a result, as explained above, since the synchronization judgement by the timing phase synchronization detecting circuit is done in high precision, the timing phase capturing operation, the carrier frequency capturing operation, and also the carrier frequency phase capturing operation can be quickly completed by the demodulator of the embodiment 2 while the "$0\pi$" modulation signal is received, as compared with the demodulator of the embodiment 1.

It should be understood that when the PSK-modulated random pattern is received, the timing phase synchronization detecting circuit 316 according to the embodiment 2 of the present invention owns the following problem. That is, when such a PSK-modulated random pattern is received, this timing phase synchronization detecting circuit 316 judges the present condition as the "UNLOCK condition", so that the timing recovering means 221, the frequency synchronizing means 222, and the carrier recovering means 223 are not brought into high stable conditions.

Figure 8:
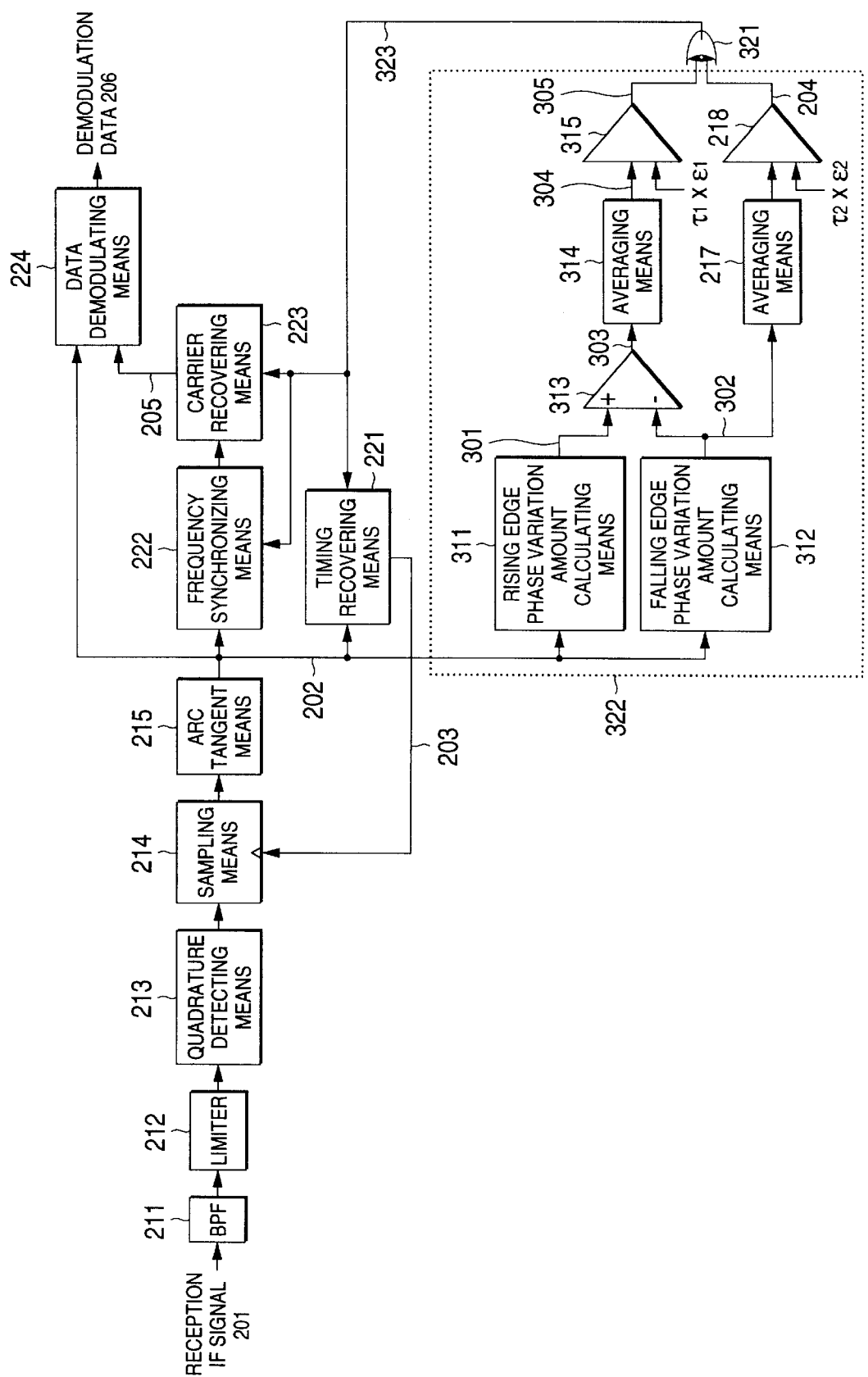
FIG. 8 is a structural diagram for indicating a timing phase synchronization detecting circuit and a demodulator with employment of this timing phase synchronization detecting circuit, which is arranged by combining the embodiment 1 of the present invention with the embodiment 2.
Figure 9:
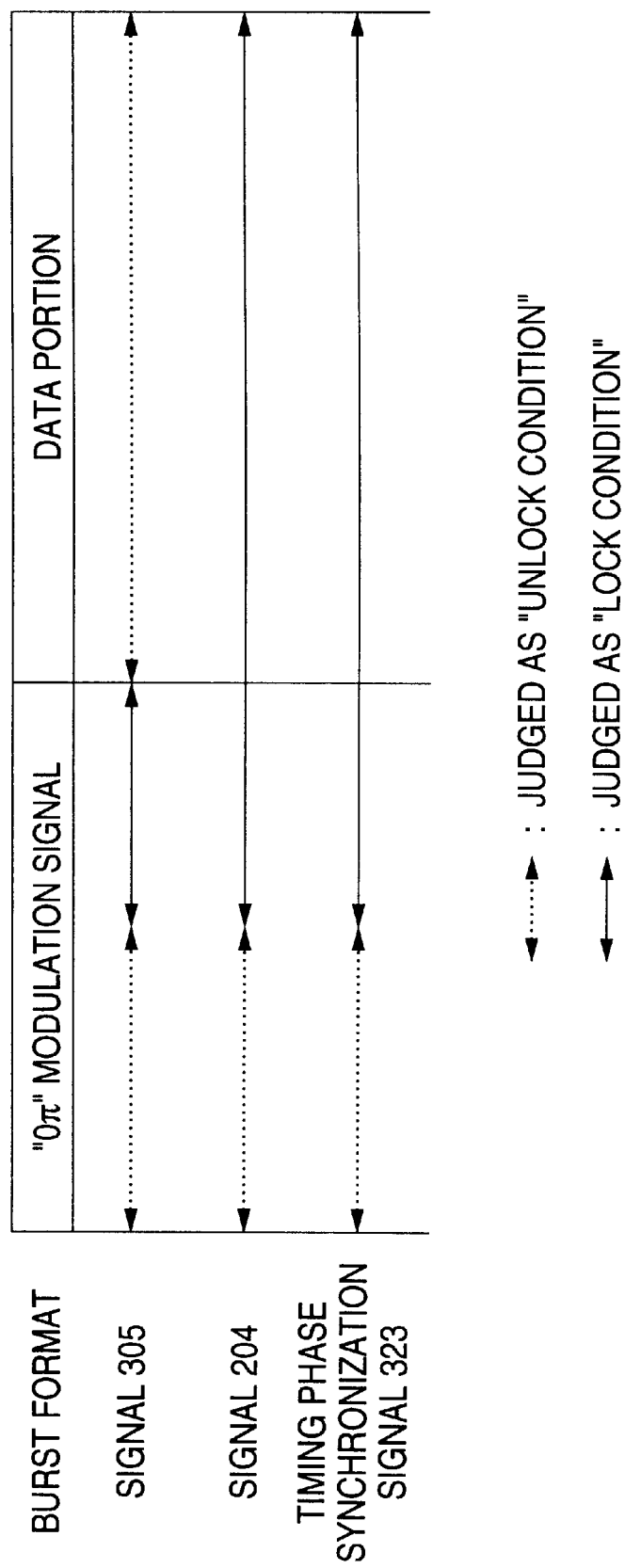
FIG. 9 shows a burst format and is a timing chart for the respective signals shown in FIG. 8.

Referring now to FIGS. 8 and 9, another embodiment capable of solving this problem will be explained.

FIG. 8 is a structural diagram for representing a timing phase synchronization detecting circuit and a demodulator, which are arranged by combining this embodiment 2 of the present invention with the embodiment 1 (FIG. 1). In this drawing, reference numeral 321 shows an OR gate, reference numeral 322 indicates a timing phase synchronization detecting circuit, and reference numeral 323 represents a timing phase synchronization signal. Also, reference numeral 217 indicates averaging means, and reference numeral 218 denotes comparing means. Other circuit elements are identical to those of FIG. 5.

FIG. 9 represents a "LOCK condition" and an "UNLOCK condition" of each of the signal 305, the signal 204, and the timing phase synchronization signal 323 shown in FIG. 8 when the "0π" modulation signal is received, and also the data portion is received.

Next, operations will now be explained.

For example, since the timing phase synchronization signal 204 indicative of the "LOCK condition" when the PSK-modulated random pattern is received as shown in the embodiment 1 is OR-gated with respect to the timing phase synchronization signal 305 of the embodiment 2, and also the timing phase synchronization detecting circuit 322 (FIG. 8) for newly producing the timing phase synchronization signal 322 (FIG. 9) is employed, the present condition can be judged as the "LOCK condition" even if the PSK-modulated random pattern is received.

Figure 10:
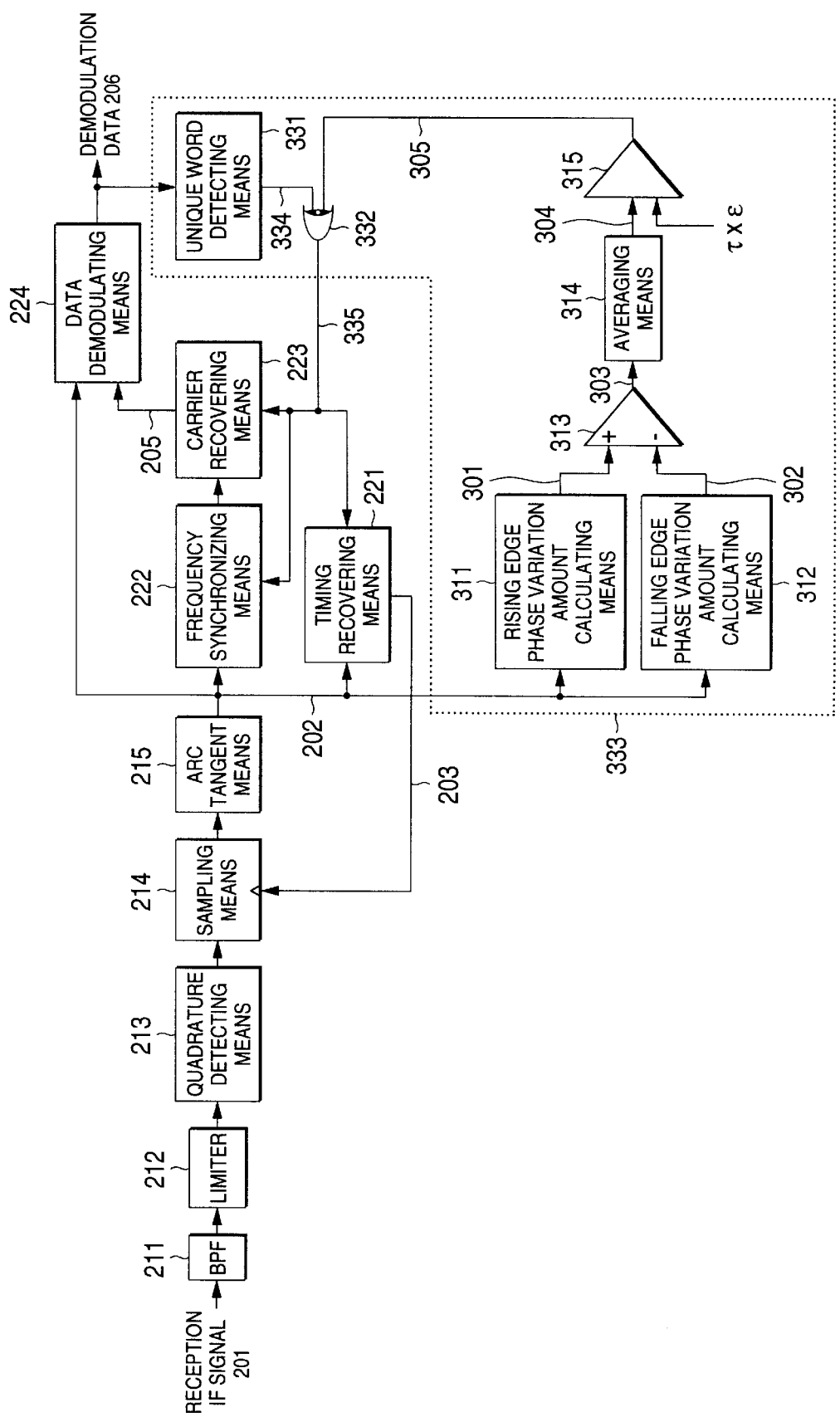
FIG. 10 is a structural diagram for indicating a timing phase synchronization detecting circuit and a demodulator with employment of this timing phase synchronization detecting circuit, which is arranged by combining the embodiment 2 of the present invention with a unique word detecting circuit.
Figure 11:
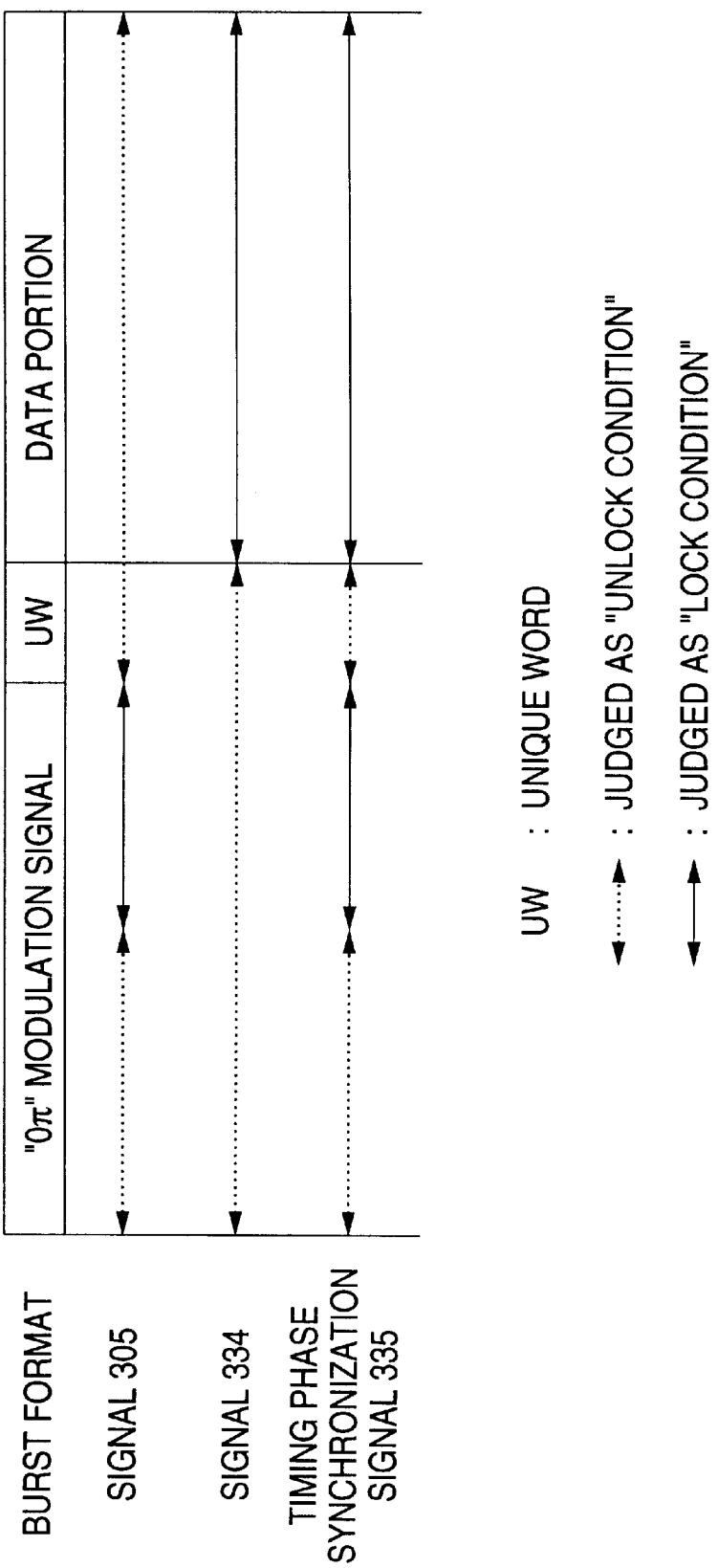
FIG. 11 shows a burst format and is a timing chart for the respective signals shown in FIG. 10.

Referring now to FIGS. 10 and 11, another embodiment capable of solving this problem will be explained.

FIG. 10 is a structural diagram for representing a timing phase synchronization detecting circuit and a demodulator, which are arranged by combining this embodiment 2 of the present invention with a unique word detecting circuit. In this drawing, reference numeral 331 indicates a unique word detecting circuit, reference numeral 332 shows an OR gate, reference numeral 333 indicates a timing phase synchronization detecting circuit, reference numeral 334 shows a unique word detection signal, and reference numeral 335 represents a timing phase synchronization signal. Also, other circuit elements are identical to those of FIG. 5, and therefore, explanations are omitted.

FIG. 11 represents a "LOCK condition" and an "UNLOCK condition" of each of the signal 305, the signal 334, and the timing phase synchronization signal 335 shown in FIG. 10 when the "0π" modulation signal is received, the unique word is received, and also the data portion is received.

Next, operations will now be described.

As another embodiment for solving the above-described problem, for instance, after the unique word is detected by the unique word detecting circuit 331 with employment of a burst format having such a unique word (UW) as represented in FIG. 11, the timing phase detecting circuit 333 (FIG. 10) judges the present condition as the "LOCK condition (FIG. 11)". Then, while using this timing phase synchronization detecting circuit 333, when the PSK-modulated random pattern (data portion) is received, the timing recovering means 221, the frequency synchronization means 222, and the carrier recovering means 223 are brought into the high stable condition, so that the present condition can be judges as the "LOCK condition" even when the PSK-modulated random pattern is received.

(EMBODIMENT 3)

In the embodiment 3, the timing phase synchronization detecting circuit averages the difference value between the phase variation amount of the rising edge ad the phase variation amount of the falling edge from the baseband phase data 202, and judges as to whether or not the timing phase synchronization can be established based on a predetermined value and the comparison result.

In accordance with this embodiment, a timing phase synchronization detecting circuit is operated at a rate two times higher than a symbol rate to perform a differentiation and an averaging operation between a rising edge phase variation amount and a falling edge phase variation amount from the baseband phase data 202.

Figure 12:
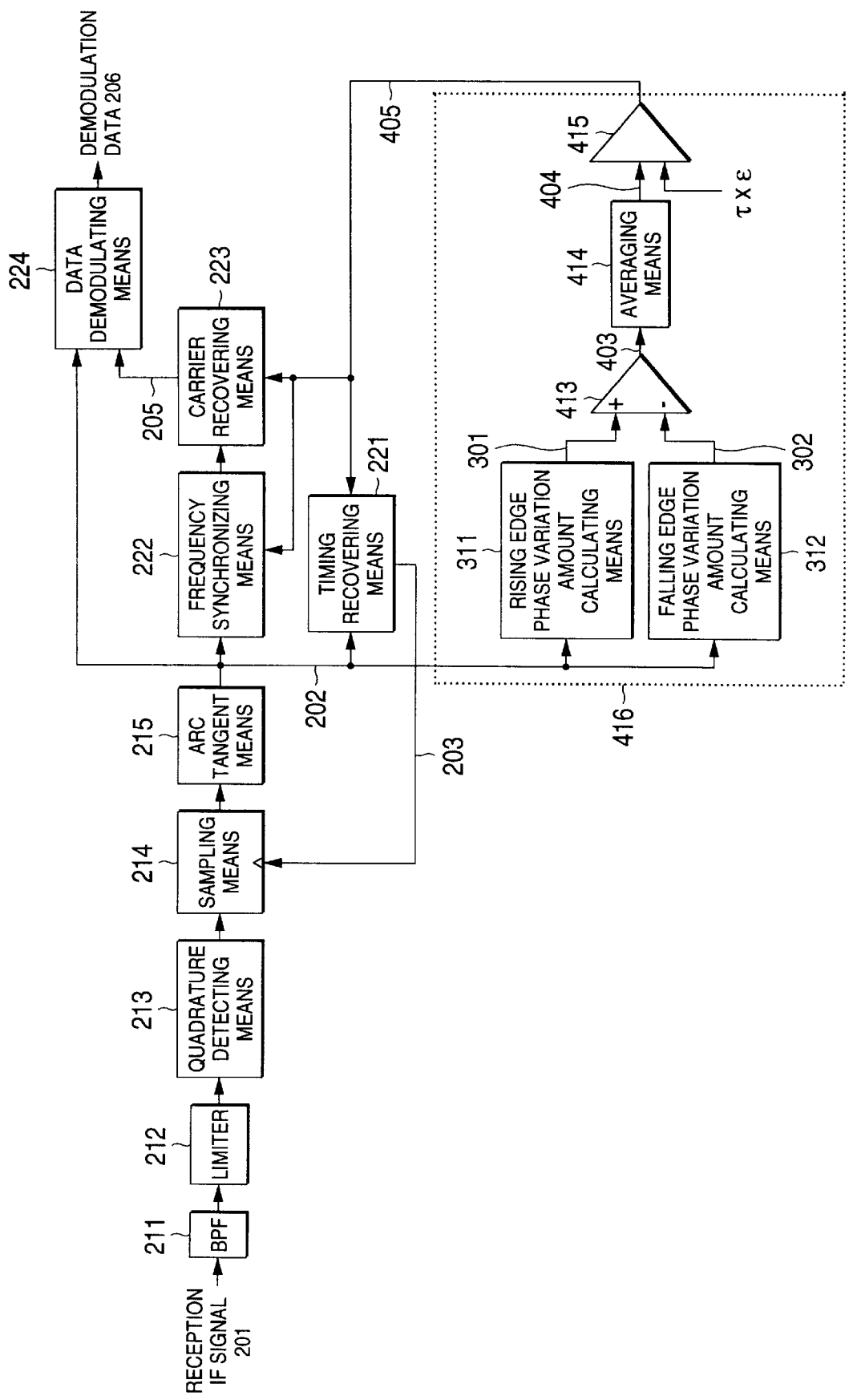
FIG. 12 is a structural diagram for indicating a timing phase synchronization detecting circuit and a demodulator with employment of this timing phase synchronization detecting circuit according to an embodiment 3 of the present invention.
Figure 13:
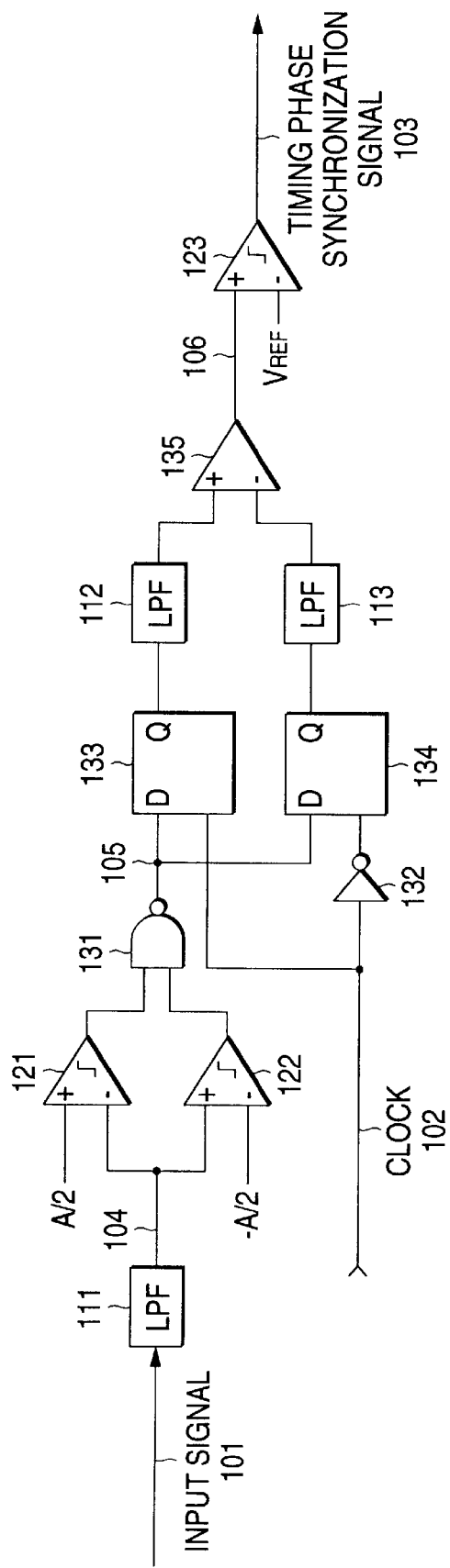
FIG. 13 is a structural diagram for indicating the conventional timing phase synchronization detecting circuit.
Figure 15:
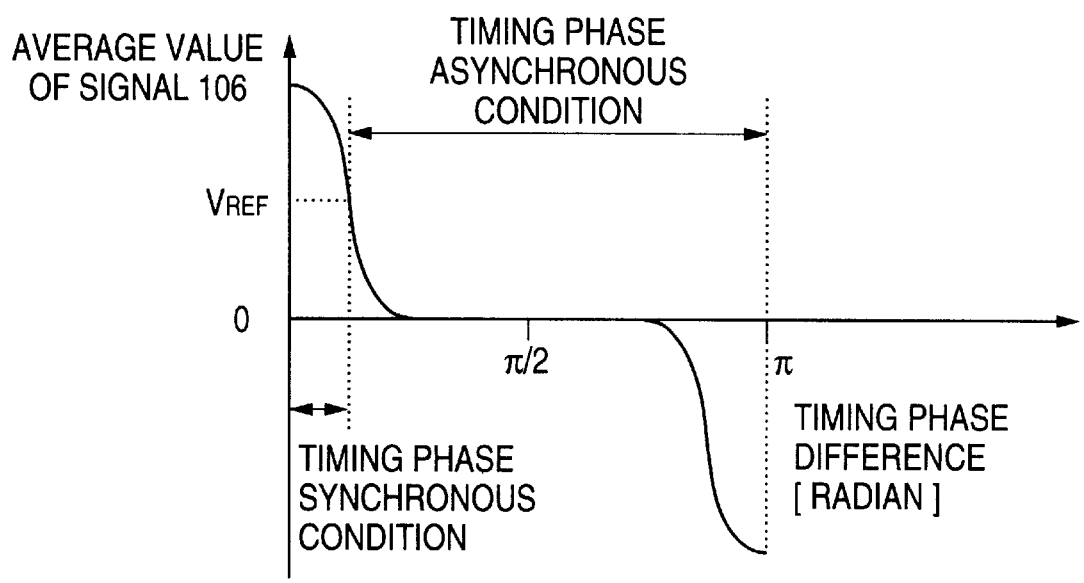
FIG. 15 is a diagram for showing the output characteristic of the differentiator 135 with respect to the timing phase difference.

FIG. 12 is a structural diagram for indicating a timing phase synchronization detecting circuit and a demodulator with employment of this timing phase synchronization detecting circuit, according to this embodiment 3.

In this drawing, reference numeral 403 shows a differentiated phase variation amount, reference numeral 404 is an average value signal of the differentiated phase variation amount, reference numeral 405 indicates a timing phase synchronization signal, and reference numeral 416 represents a timing phase synchronization detecting circuit.

In the timing phase synchronization detecting circuit 416, reference 413 shows differentiating means, reference numeral 414 represents averaging means, and reference numeral 415 denotes comparing means. Other circuit elements are identical to those of FIG. 5, and therefore, descriptions thereof are omitted.

The timing phase detecting circuit 416 judges any one of the below-mentioned two conditions based upon such a baseband phase data 202 sampled at a rising edge and a falling edge of the recovered symbol clock 203:

UNLOCK CONDITION: Such a condition that a timing phase difference between a rising edge of the recovered symbol clock 203 and a Nyquist point of the baseband phase data 202 is large when the "0π" modulation signal is received. Otherwise, either noise or a PSK-modulated random pattern is received.

LOCK CONDITION: Such a condition that the rising edge of the recovered symbol clock 203 impinges at a point near the Nyquist point of the baseband phase data 202 when the "0π" modulation signal is received.

Next, a description will now be made of operations of the demodulator according to the embodiment 3 of the present invention with reference to FIG. 12. In FIG. 12, in the demodulator according to the embodiment 3, first of all, the reception IF signal 201 is filtered by the bandpass filter means 211, and then the filtered IF signal is amplified by the limiter amplifying means 212 so as to obtain a: constant amplitude thereof. Then, the amplified signal is quadrature-detected by the quadrature detecting means 213 to output a complex baseband signal. Then, the sampling means 214 samples the complex baseband signal outputted from the quadrature detecting means 213 at the rising edge of the recovered symbol clock 203 and the falling edge thereof (two times per 1 symbol in total). Furthermore, the arc tangent means 215 calculates a vector angle of the composite baseband signal from this composite baseband signal sampled by said sampling means 214 to thereby produce the baseband phase data 202.

Next, operations of the timing phase synchronization detecting circuit 416 will now be explained. In the timing phase synchronization detecting circuit 416 of the present invention, similar to the embodiment 2, as indicated in the below-mentioned formula, the rising edge phase variation amount calculating means 311 differentiates the phase data stream sampled at the rising edge by 1 symbol with respect to another phase data stream $\{\theta_i\}$ [radian] (note that i=0, 1, 2, 3, - - -), which is produced by sampling the baseband phase data 202 at the rising edge and the falling edge of the recovered symbol clock 203. Furthermore, the rising edge phase variation amount calculating means 311 converts this differentiated data stream into an absolute value thereof, so that a value $\omega^{(u)}{}_j$ of the rising edge phase variation amount 301 ($0 \leq \omega^{(u)}{}_j \leq \pi$, j=0, 1, 2, 3, - - - ):

$$\omega^{(u)}{}_j = \min\{|\theta_{2j} - \theta_{2(j-1)}|, 2\pi - |\theta_{2j} - \theta_{2(j-1)}|\}$$

Similarly, the falling edge phase variation amount calculating means 312 calculates a value $\omega^{(d)}{}_j$ of the falling edge phase variation amount 302 ($0 \leq \omega^{(d)}{}_j \leq \pi$), as indicated in the following formula:

$$\omega^{(d)}{}_j = \min\{|\theta_{2j+1} - \theta_{2(j-1)+1}|, 2\pi - |\theta_{2j+1} - \theta_{2(j-1)+1}|\}$$

As represented in the below-mentioned formulae (1) and (2), the differentiating means 413 calculates a value $\omega^{(D)}{}_i$ ($-\pi \leq \omega^{(D)}{}_i \leq \pi$) of the differentiated phase variation amount 403. It should be noted that the value $\omega^{(D)}{}_i$ is updated during both the rising edge of the recovery symbol 203 and the falling edge of the recovery symbol 203, namely this value is updated twice within a reception time interval of 1 symbol.

(in case of i=2j) - - - $\omega^{(D)}{}_i$=- - -  (1)

(in case of i=2j+1) - - - $\omega^{(D)}{}_i$=- - -  (2).

In such a case that the timing phase synchronization condition is established while the "0π" modulation signal is received, there are great possibilities that $\omega^{(D)}{}_i$ owns a positive value, whereas $\omega^{(D)}{}_i$ owns a value defined between 0 and a negative value under timing phase asynchronous condition while receiving the "0π" modulation signal. When either noise is received or the PSK-modulated random pattern is received, $\omega^{(D)}{}_i$ owns a random value defined between $-\pi$ and $\pi$.

Accordingly, the averaging means 414 enters "$\omega^{(D)}{}_i$" having the above-described value into a shift register arranged by "τ" stages (symbol "τ" being a natural number) every 1 symbol two times (since $\omega^{(D)}{}_i$ is updated during rising/falling edges of recovery symbol 203), and outputs a value of a total value "$\Omega_i$" for τ as an average value signal 404 of the phase variation amount:

$$\Omega_i = \sum_{t=i-\tau+1}^{i} \omega^{(D)t} \tag{3}$$

As a consequence, the comparing means 415 compares the value $\Omega_i$ of the average value signal 404 with a value obtained by "τ×∈" (0<∈<π). If $\Omega_i \geq \tau \times \in$, then the timing phase synchronization detecting circuit 416 judges the present condition as an "UNLOCK condition". Conversely, if $\Omega_i < \tau \times \in$, then the timing phase synchronization detecting circuit 416 of the present invention judges the present condition as a "LOCK" condition.

As previously described, in accordance with the timing phase synchronization detecting circuit of the embodiment 2 of the present invention, the timing phase synchronization can be judged as either the "UNLOCK condition" or the "LOCK condition" based upon the baseband phase data 202. Since in the timing phase synchronization detecting circuit according to the embodiment 3 of the present invention, both the differentiating means 413 and the averaging means 414 are operated at the rate two times higher than the symbol rate, the timing phase synchronization can be judged having the substantially same judging precision as that of the embodiment 2 within short time, as compared with the above-explained timing phase synchronization detecting circuit of the embodiment 2, in which both the differentiating means 313 and the averaging means 314 are operated at the symbol rate.

It should also be noted that since the operations of the timing recovering means 221, the frequency synthesizing means 222, and the carrier recovering means 223 with employment of the above-explained timing phase synchronization signal are identical to those of the embodiment 2, descriptions thereof are omitted.

As a consequence, since the demodulator of the embodiment 3 can judge the timing phase synchronization within short time with maintaining the substantially same judgement precision as that of the embodiment 2 when the "0π" modulation signal is received, the timing phase capturing operation, the carrier frequency capturing operation, and also the carrier frequency phase capturing operation can be quickly completed by the demodulator of the embodiment 3.

It should also be understood that when the PSK-modulated random pattern is received similar to the embodiment 2, the timing phase synchronization detecting circuit 416 according to the embodiment 3 of the present invention owns the following problem. That is, when such a PSK-modulated random pattern is received, this timing phase synchronization detecting circuit 416 judges the present condition as the "UNLOCK condition", so that the timing recovering means 221, the frequency synchronizing means 222, and the carrier recovering means 223 are not brought into high stable conditions. As a method for solving this problem, similar to the embodiment 2, there are one method for combining the timing phase synchronization detecting circuit shown in the embodiment 1 with the embodiment 3, and another method for using the unique word detecting circuit.

Since the present invention has been arranged, as described above, the below-mentioned effects can be achieved.

In accordance with the first aspect of the invention, since the "0π" modulation signal equal to the known pattern is employed in the preamble, the timing phase synchronization detecting circuit can judge in high precision, the timing phase synchronization established between the Nyquist point of the baseband phase data and the rising edge of the recovered symbol clock outputted from the feedback type timing recovering means.

In accordance with the second aspect of the invention, since the timing phase synchronization detecting circuit can establish the synchronization by employing the phase information of the reception signal, the limiter amplifier can be provided at the prestage of the demodulator, and no longer the AGC circuit is required. Therefore, it is possible to obtain such a compact demodulator with a simple circuit arrangement. Also, in response to the timing phase synchronization signal outputted from the above timing phase synchronization detecting circuit, the frequency range of the loop filter constituted by the timing recovering means, the frequency synchronizing means, and the carrier recovering means are variable. As a result, the timing recovering operation, the carrier frequency synchronizing operation, and the carrier recovering operation can be captured in high speeds, and thereafter can be brought into high stable conditions. Thus, it is possible to realize such a demodulator capable of achieving the better BER (bit error rate) characteristic.

In accordance with the third aspect of the invention, the timing phase synchronization detecting circuit calculates the rising edge phase variation amount calculated from the baseband phase data sampled at the rising edge of the recovered symbol clock in addition to the falling edge phase variation amount calculated from the baseband phase data sampled at the falling edge of the recovered symbol clock. As a consequence, when the "0π" modulation signal is received, the synchronization judgement precision of the timing phase synchronization detecting circuit can be improved.

In accordance with the fourth aspect of the invention, the timing phase synchronization detecting circuit employs the differentiating means for subtracting the falling edge phase variation amount from the rising edge phase variation amount every time either the rising edge phase variation amount or the falling edge phase variation amount is updated (namely two times per 1 symbol) to thereby calculate the differentiated phase variation amount. As a result, it is possible to obtain such a timing phase synchronization detecting circuit having the better synchronization judgement precision, while the time period required to execute the averaging process operation at the averaging means provided subsequent to the differentiating means can be shortened.

In accordance with the fifth aspect of the invention, even when the PSK-modulated unique word is detected, since the timing phase synchronization detecting circuit judges the present condition as the "LOCK condition", the high stable condition can be maintained even if the PSK-modulated random pattern is received.

In accordance with the sixth aspect of the invention, since the averaging means for not only the differentiated phase variation amount, but also the falling edge phase variation amount is employed, the high stable condition can be maintained even when the PSK-modulated random pattern is received.

In accordance with the seventh aspect of the invention, since the synchronization judgement precision of the timing phase synchronization detecting circuit can be improved, such a demodulator can be accomplished by which the timing phase capturing operation, the carrier frequency capturing operation, and the carrier frequency phase capturing operation can be realized within the shorter time period.

What is claimed is:

1. A timing phase synchronization detecting circuit comprising:

phase variation amount calculating means for entering thereinto a baseband phase signal of a burst signal constructed of a preamble which contains a "0π" modulation signal, and also a PSK-modulated random pattern; for differentiating said baseband phase signal sampled at a falling edge of a recovered symbol clock by 1 symbol; and furthermore for converting the 1-symbol-differentiated baseband phase signal into an absolute value thereof to calculate a phase variation amount;

averaging means for executing an averaging process operation of a specific symbol of said phase variation amount; and comparing means for comparing a signal outputted from said averaging means with a specific threshold value to thereby output a timing phase synchronization signal indicative of any one of the following states:

such a condition (will be referred to as an "UNLOCK condition" hereinafter) that a timing phase difference between a rising edge of the recovered symbol clock and a Nyquist point of the baseband phase signal is large when the "0π" modulation signal is received; and such a condition (will be referred to as a "LOCK condition" hereinafter) that the rising edge of the recovered clock impinges at a position near the Nyquist point of the baseband phase signal, or either noise or the PSK-modulated random pattern is received.

2. A timing phase synchronization detecting circuit as recited in claim 1, further comprising:

timing recovering means arranged by input means, bandpass filter means, limiter amplifying means, quadrature detecting means, sampling means, arc tangent means, and the timing phase synchronization detecting circuit, for controlling a phase of a recovered symbol clock in such a manner that a Nyquist point of a baseband phase signal is sampled at a rising edge of said recovered symbol clock; for outputting a recovered symbol clock used to sample a complex baseband signal by said sampling means in response to a rising edge and a falling edge (two times per 1 symbol in total); and for outputting to said sampling means, such a recovered symbol clock that when said timing phase synchronization detecting circuit detects the UNLOCK condition, a frequency range of a phase lock loop (will be abbreviated as a "PLL" hereinafter) is widened, whereas when said timing phase synchronization detecting circuit detects the LOCK condition, the frequency range of said PLL is made narrow; said input means inputting an, IF burst signal constructed of a preamble having a "0" modulation signal and a PSK-modulated random pattern; said bandpass filter means filtering said IF burst signal; said limiter amplifying means amplifying the filtered signal to produce a constant amplitude; said quadrature detecting means quadrature-detecting the limiter-amplified signal to thereby output a quadrature-detected signal as the complex baseband signal; said sampling means sampling said complex baseband signal in response to a rising edge and a falling edge of a recovered symbol clock used to recover the timing; arc tangent means outputting a vector angle of said complex baseband signal sampled by said sampling means as the baseband phase signal; and also said timing phase synchronization detecting circuit outputting the timing phase synchronization signal indicative of any one of the LOCK condition and the UNLOCK condition based upon the value of said baseband phase signal sampled at the falling edge of said recovered symbol clock;

frequency synchronizing means for executing a carrier frequency synchronization by using said baseband phase signal sampled in response to both the rising edge and the falling edge of said recovered symbol clock when said timing phase synchronization detecting circuit detects the UNLOCK condition; and for performing a carrier frequency synchronization by using only said baseband phase signal sampled at the rising edge of said recovered symbol clock when said timing phase synchronization detecting circuit detects the LOCK condition;

carrier recovering means for executing a carrier recovering operation by employing said baseband phase signal sampled in response to both the rising edge and the falling edge of said recovered symbol clock when said timing phase synchronization detecting circuit detects the UNLOCK condition; and for performing a carrier recovering operation by-using only said baseband phase signal sampled in response to the rising edge of said recovered symbol clock when said timing phase synchronization detecting circuit detects the LOCK condition; and data demodulating means for demodulating reception data based upon both said baseband phase signal sampled at the rising edge of said recovered symbol clock and the recovered carrier signal outputted from said carrier recovering means to thereby output the demodulated data.

3. A timing phase synchronization detecting circuit comprising:

rising-edge phase variation amount calculating means for calculating a phase variation amount of a rising edge of a recovered symbol clock in such a manner that a baseband phase signal of a burst signal is inputted into said rising-edge phase variation amount calculating means; said burst signal is constituted by a preamble having a "0π" modulation signal, and also a PSK-modulated random pattern; said baseband phase signal sampled at the rising edge of said recovered symbol clock is differentiated by 1 symbol; and further the differentiated baseband phase signal is converted into an absolute value thereof;

falling-edge phase variation amount calculating means for calculating a phase variation amount of a falling edge of said recovered symbol clock in such a manner that said baseband phase signal sampled at the falling edge of said recovered symbol clock is differentiated by 1 symbol; and further the differentiated baseband phase signal is converted into an absolute value thereof;

differentiating means for calculating a differentiated phase variation amount by subtracting said falling-edge phase variation amount from said rising-edge phase variation amount every 1 symbol;

averaging means for executing an averaging process for a specific symbol of said differentiated phase variation amount; and comparing means for comparing a signal outputted from said averaging means with a specific threshold value to thereby output a timing phase synchronization signal indicative of any one of the following two conditions;

such a condition (will be referred to as an "UNLOCK" condition hereinafter) that a timing phase difference between the rising edge of the recovered symbol clock and a Nyquist point of the baseband phase signal is large when the "0" modulation signal is received, or either noise or the PSK-modulated random pattern is under reception; and such a condition (will be referred to as a "LOCK condition" hereinafter) that the rising edge of the recovered symbol clock impinges at a point near the Nyquist point of the baseband phase signal when the "0π" modulation signal is received.

4. A timing phase synchronization detecting circuit comprising:

rising-edge phase variation amount calculating means for calculating a phase variation amount of a rising edge of a recovered symbol clock in such a manner that a baseband phase signal of a burst signal is inputted into said rising-edge phase variation amount calculating means; said burst signal is constituted by a preamble having a "0π" modulation signal, and also a PSK-modulated random pattern; said baseband phase signal sampled at the rising edge of said recovered symbol clock is differentiated by 1 symbol; and further the differentiated baseband phase signal is converted into an absolute value thereof;

falling-edge phase variation amount calculating means for calculating a phase variation amount of a falling edge of said recovered symbol clock in such a manner that said baseband phase signal sampled at the falling edge of said recovered symbol clock is differentiated by 1 symbol; and further the differentiated baseband phase signal is converted into an absolute value thereof;

differentiating means for calculating a differentiated phase variation amount by subtracting said falling-edge phase variation amount from said rising-edge phase variation amount every time any one of said rising-edge phase variation amount and said falling-edge phase variation amount is updated;

averaging means for performing an averaging process with respect to said differentiated phase variation amount specific calculating times; and comparing means for comparing a signal outputted from said averaging means with a specific threshold value to thereby output a timing phase synchronization signal indicative of any one of the following two conditions;

such a condition (will be referred to as an "UNLOCK" condition hereinafter) that a timing phase difference between the rising edge of the recovered symbol clock and a Nyquist point of the baseband phase signal is large when the "0π" modulation signal is received, or either noise or the PSK-modulated random pattern is under reception; and such a condition (will be referred to as a "LOCK condition" hereinafter) that the rising edge of the recovered symbol clock impinges at a point near the Nyquist point of the baseband phase signal when the "0π," modulation signal is received.

5. A timing phase synchronization detecting circuit comprising:

rising-edge phase variation amount calculating means for calculating a phase variation amount of a rising edge of a recovered symbol clock in such a manner that a baseband phase signal of a burst signal is inputted into said rising-edge phase variation amount calculating means; said burst signal is constituted by a preamble having a "0π" modulation signal, a PSK-modulated unique word, and also a PSK-modulated random pattern; said baseband phase signal sampled at the rising edge of said recovered symbol clock is differentiated by 1 symbol; and further the differentiated baseband phase signal is converted into an absolute value thereof;

falling-edge phase variation amount calculating means for calculating a phase variation amount of a falling edge of said recovered symbol clock in such a manner that said baseband phase signal sampled at the falling edge of said recovered symbol clock is differentiated by 1 symbol; and further the differentiated baseband phase signal is converted into an absolute value thereof;

differentiating means for calculating a differentiated phase variation amount by subtracting said falling-edge phase variation amount from said rising-edge phase variation amount every time any one of said rising-edge phase variation amount and said falling-edge phase variation amount is updated;

averaging means for performing an averaging process with respect to said differentiated phase variation amount specific calculating times;

comparing means for comparing a signal outputted from said averaging means with a specific threshold value to thereby output a synchronization condition signal indicative of any one of the following two conditions;

such a condition (will be referred to as an "UNLOCK" condition hereinafter) that a timing phase difference between the rising edge of the recovered symbol clock and a Nyquist point of the baseband phase signal is large when the "0π" modulation signal is received, or either noise or the PSK-modulated random pattern is under reception;

such a condition (will be referred to as a "LOCK condition" hereinafter) that the rising edge of the recovered symbol clock impinges at a point near the Nyquist point of the baseband phase signal when the "0π" modulation signal is received;

unique word detecting means for detecting a unique word from demodulated data; and OR means for outputting a timing phase synchronization signal brought into the LOCK condition if a synchronization condition signal is brought into the LOCK condition, or said unique word detecting means detects the unique word.

6. A timing phase synchronization detecting circuit comprising:

rising-edge phase variation amount calculating means for calculating a phase variation amount of a rising edge of a recovered symbol clock in such a manner that a baseband phase signal of a burst signal is inputted into said rising-edge phase variation amount calculating means; said burst signal is constituted by a preamble having a "0π" modulation signal, and also a PSK-modulated random pattern; said baseband phase signal sampled at the rising edge of said recovered symbol clock is differentiated by 1 symbol; and further the differentiated baseband phase signal is converted into an absolute value thereof;

falling-edge phase variation amount calculating means for calculating a phase variation amount of a falling edge of said recovered symbol clock in such a manner that said baseband phase signal sampled at the falling edge of said recovered symbol clock is differentiated by 1 symbol; and further the differentiated baseband phase signal is converted into an absolute value thereof;

differentiating means for calculating a differentiated phase variation amount by subtracting said falling-edge phase variation amount from said rising-edge phase variation amount every time any one of said rising-edge phase variation amount and said falling-edge phase variation amount is updated;

first averaging means for performing an averaging process with respect to said differentiated phase variation amount specific calculating times;

first comparing means for comparing a signal outputted from said first averaging means with a first threshold value to thereby output a synchronization condition signal indicative of any one of the following two conditions;

such a condition (will be referred to as an "UNLOCK" condition hereinafter) that a timing phase difference between the rising edge of the recovered symbol clock and a Nyquist point of the baseband phase signal is large when the "0π" modulation signal is received, or either noise or the PSK-modulated random pattern is under reception; and such a condition (will be referred to as a "LOCK condition" hereinafter) that the rising edge of the recovered symbol clock impinges at a point near the Nyquist point of the baseband phase signal when the "0π" modulation signal is received;

second averaging means for averaging the falling-edge phase variation amount derived from said falling-edge phase variation amount calculating means;

second comparing means for comparing a signal outputted from said second averaging means with a second threshold value; and OR means for outputting a timing phase synchronization signal for indicating that any one of said first comparing means and said second comparing means is brought into the LOCK condition.

7. A timing phase synchronization detecting circuit as recited in claim 3, further comprising:

input means for inputting an IF burst signal constructed of a preamble having a "0π" modulation signal and a PSK-modulated random pattern; bandpass filter means for filtering said IF burst signal; limiter amplifying means for amplifying the filtered signal to produce a constant amplitude; quadrature detecting means for quadrature-detecting the limiter-amplified signal to thereby output a quadrature-detected signal as a complex baseband signal; sampling means sampling said complex baseband signal in response to a rising edge and a falling edge of a recovered symbol clock used to recover the timing; arc tangent means for outputting a vector angle of said complex baseband signal sampled by said sampling means as a baseband phase signal;

a timing phase synchronization detecting circuit, for judging as to whether the timing phase synchronization is under LOCK condition, or UNLOCK condition based upon a baseband phase signal value sampled at a rising edge and a falling edge of a recovered symbol clock and for outputting a judgement result as a timing phase synchronization signal;

timing recovering means for controlling a phase of said recovered symbol clock in such a manner that a Nyquist point of said baseband phase signal is sampled at the rising edge of said recovered symbol clock; for widening a frequency range of a phase lock loop (will be abbreviated as a "PLL" hereinafter) when said timing phase synchronization detecting circuit detects an UNLOCK condition; and for narrowing the frequency range of the PLL when said timing phase synchronization detecting circuit detects a LOCK condition;

frequency synchronizing means for executing a carrier frequency synchronization by using said baseband phase signal sampled in response to both the rising edge and the falling edge of said recovered symbol clock when said timing phase synchronization detecting circuit detects the UNLOCK condition; and for performing a carrier frequency synchronization by using only said baseband phase signal sampled at the rising edge of said recovered symbol clock when said timing phase synchronization detecting circuit detects the LOCK condition;

carrier recovering means for executing a carrier recovering operation by employing said baseband phase signal sampled in response to both the rising edge and the falling edge of said recovered symbol clock when said timing phase synchronization detecting circuit detects the UNLOCK condition; and for performing a carrier recovering operation by using only said baseband phase signal sampled in response to the rising edge of said recovered symbol clock when said timing phase synchronization detecting circuit detects the LOCK condition; and data demodulating means for demodulating reception data based upon both said baseband phase signal sampled at the rising edge of said recovered symbol clock and the recovered carrier signal outputted from said carrier recovering means to thereby output the demodulated data.

* * * * *